United States Patent
Yeh

(10) Patent No.: US 7,324,376 B2
(45) Date of Patent: *Jan. 29, 2008

(54) METHOD AND APPARATUS FOR OPERATING NONVOLATILE MEMORY CELLS IN A SERIES ARRANGEMENT

(75) Inventor: Chih Chieh Yeh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 207 days.

This patent is subject to a terminal disclaimer.

(21) Appl. No.: 11/191,366

(22) Filed: Jul. 28, 2005

(65) Prior Publication Data

US 2006/0050555 A1 Mar. 9, 2006

Related U.S. Application Data

(63) Continuation-in-part of application No. 10/973,593, filed on Oct. 26, 2004, and a continuation-in-part of application No. 10/973,176, filed on Oct. 26, 2004, now Pat. No. 7,170,785.

(60) Provisional application No. 60/608,455, filed on Sep. 9, 2004, provisional application No. 60/608,528, filed on Sep. 9, 2004.

(51) Int. Cl.
*G11C 16/04* (2006.01)

(52) U.S. Cl. ............ 365/185.05; 365/185.16; 365/185.17; 365/185.18; 365/185.26; 365/185.27

(58) Field of Classification Search ........ 365/185.17, 365/185.06, 185.26, 185.05, 185.27
See application file for complete search history.

(56) References Cited

U.S. PATENT DOCUMENTS

| | | | |
|---|---|---|---|
| 4,939,690 A | 7/1990 | Momodomi et al. | |
| 5,365,083 A | 11/1994 | Tada | |
| 5,768,192 A | 6/1998 | Eitan | |
| 5,814,853 A | 9/1998 | Chen | |
| 6,122,193 A * | 9/2000 | Shibata et al. | 365/185.03 |
| 6,160,286 A | 12/2000 | Chi | |
| 6,288,943 B1 * | 9/2001 | Chi | 365/185.18 |
| 6,436,769 B1 | 8/2002 | Kanamori | |
| 6,510,082 B1 | 1/2003 | Le et al. | |
| 6,657,894 B2 | 12/2003 | Yeh et al. | |
| 6,670,240 B2 | 12/2003 | Ogura et al. | |

(Continued)

OTHER PUBLICATIONS

U.S. Appl. No. 10/855,286, filed May 26, 2004, entitled "Nand-Type Non-Volatile Memory Cell and Method for Operating Same," 51 pages.

(Continued)

*Primary Examiner*—Ly Duy Pham
(74) *Attorney, Agent, or Firm*—Kenta Suzue; Haynes Beffel & Wolfeld LLP

(57) ABSTRACT

A memory cell with a charge storage structure is read by measuring current between the substrate region of the memory cell and one of the current carrying nodes of the memory cell. The read operation decreases the coupling between different parts of the charge storage structure when other parts of the charge storage structure store data that are not of interest. The sensing window of the memory cell can be greatly improved by this read operation. Example arrangements are a series of memory cells, and an array of series of memory cells.

43 Claims, 32 Drawing Sheets

U.S. PATENT DOCUMENTS

| | | |
|---|---|---|
| 6,690,601 B2 | 2/2004 | Yeh et al. |
| 6,771,543 B2 | 8/2004 | Wong et al. |
| 6,808,986 B2 | 10/2004 | Rao et al. |
| 6,816,414 B1* | 11/2004 | Prinz .................... 365/185.29 |
| 6,826,080 B2 | 11/2004 | Park et al. |
| 6,873,004 B1 | 3/2005 | Han et al. |
| 2001/0010645 A1* | 8/2001 | Tanaka et al. ......... 365/185.17 |
| 2004/0125629 A1* | 7/2004 | Scheuerlein et al. .......... 365/17 |
| 2005/0162921 A1* | 7/2005 | Kurihara ................ 365/185.24 |
| 2005/0190606 A1* | 9/2005 | Houdt et al. ........... 365/185.28 |
| 2006/0050554 A1* | 3/2006 | Yeh ....................... 365/185.01 |

OTHER PUBLICATIONS

Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp. 931-934.

* cited by examiner

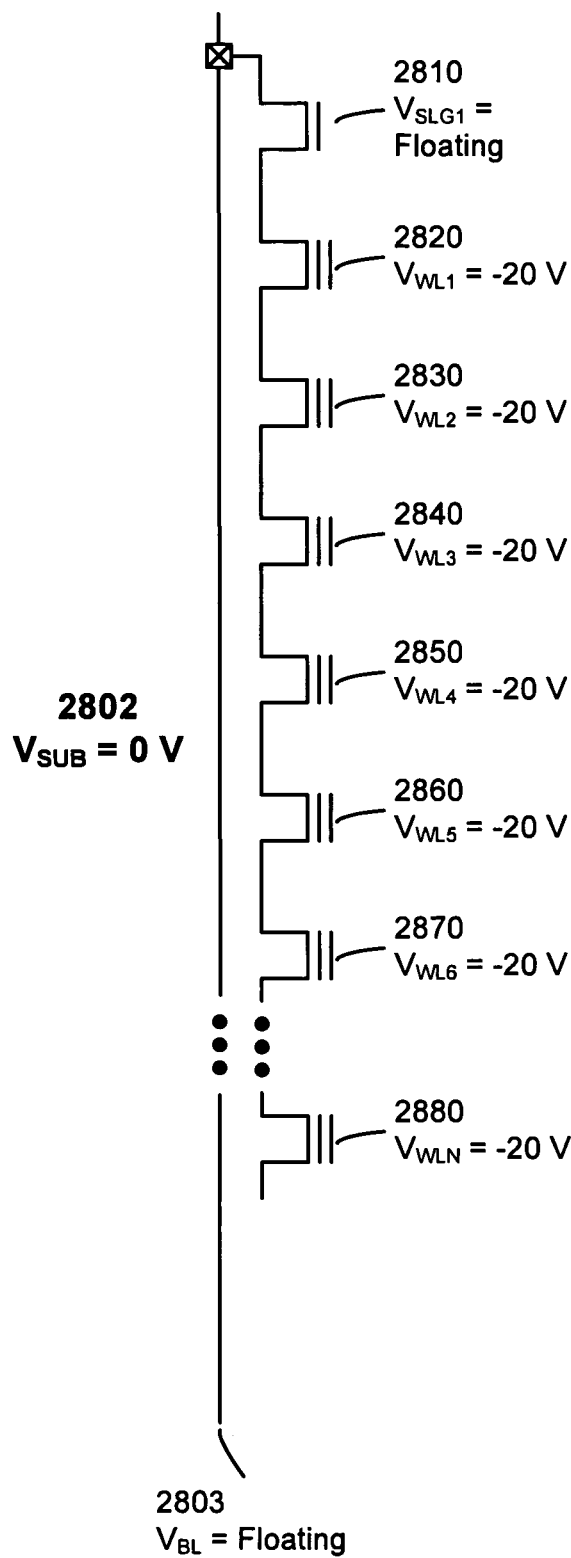
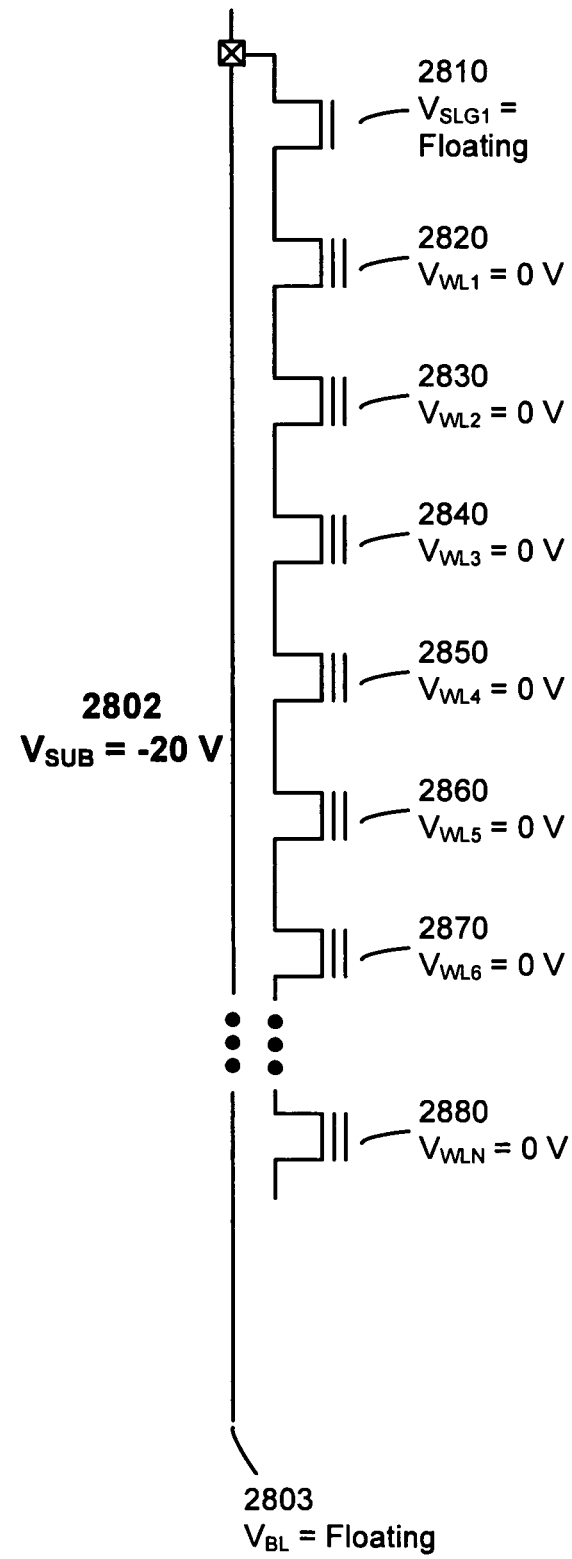
Fig. 28
Fig. 29

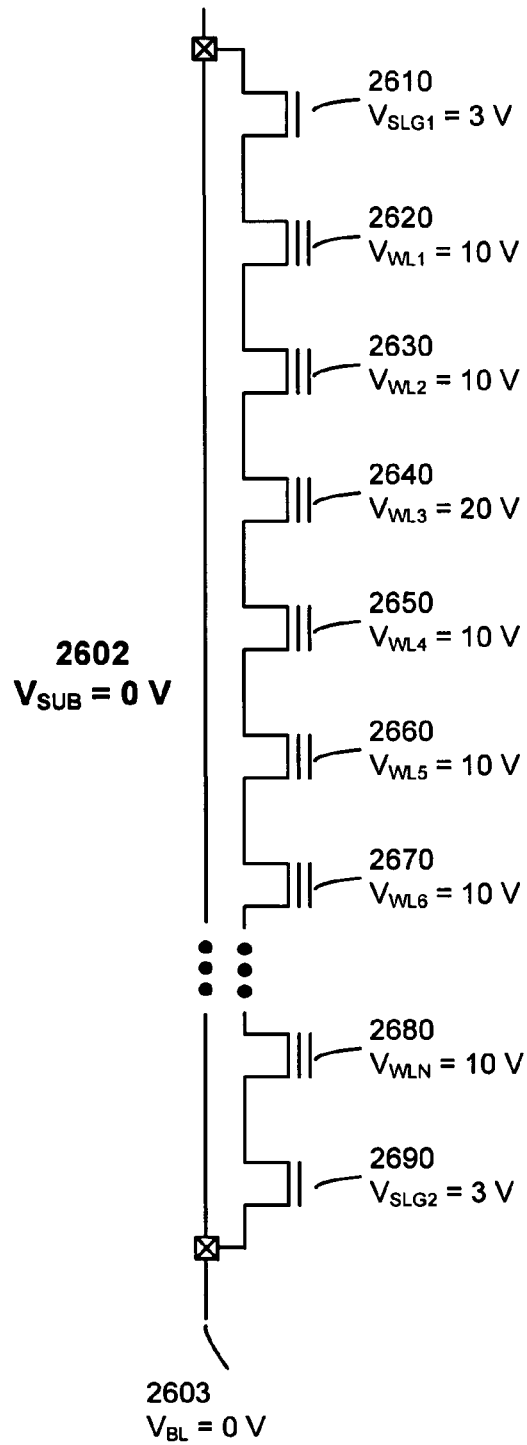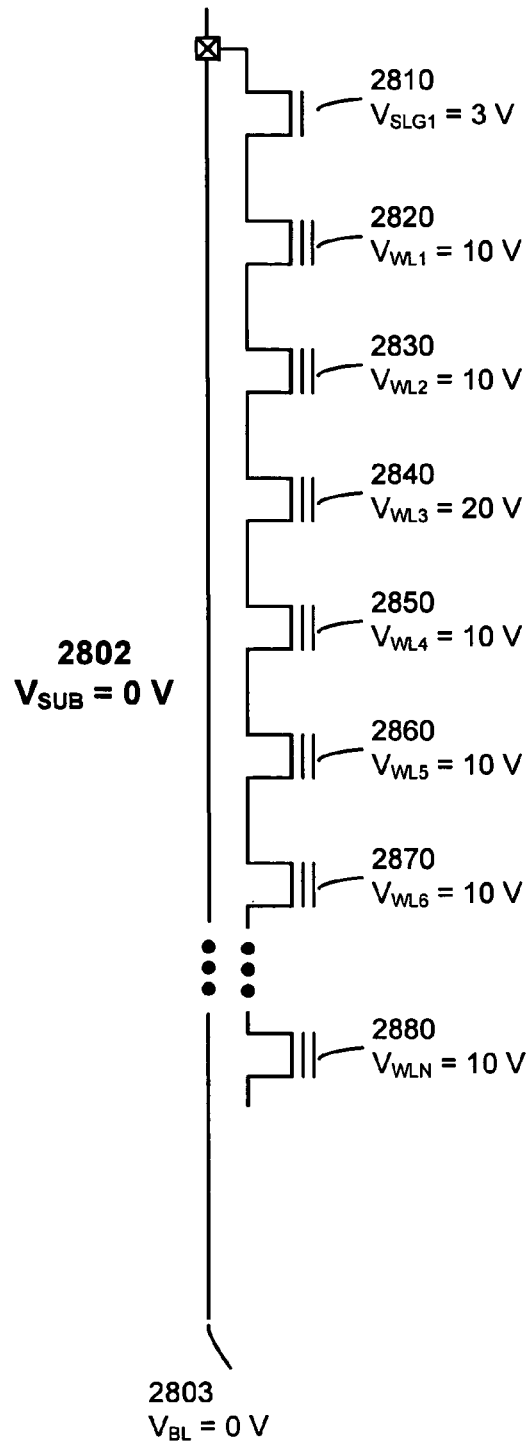
Fig. 30
Fig. 31

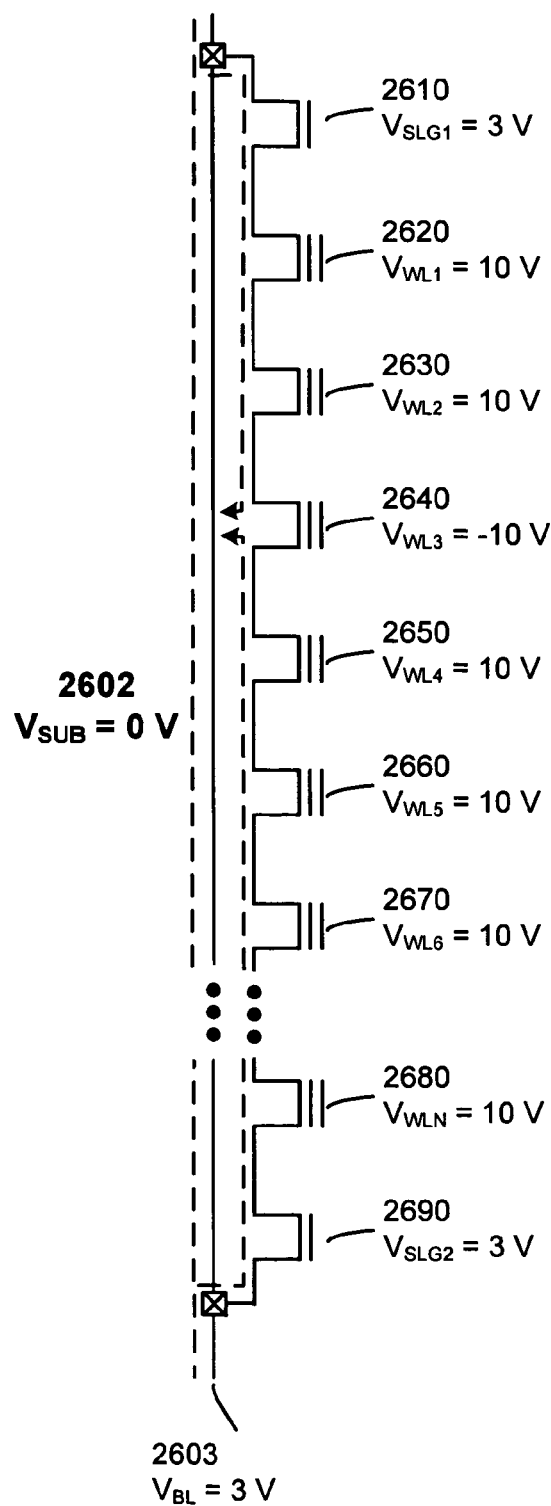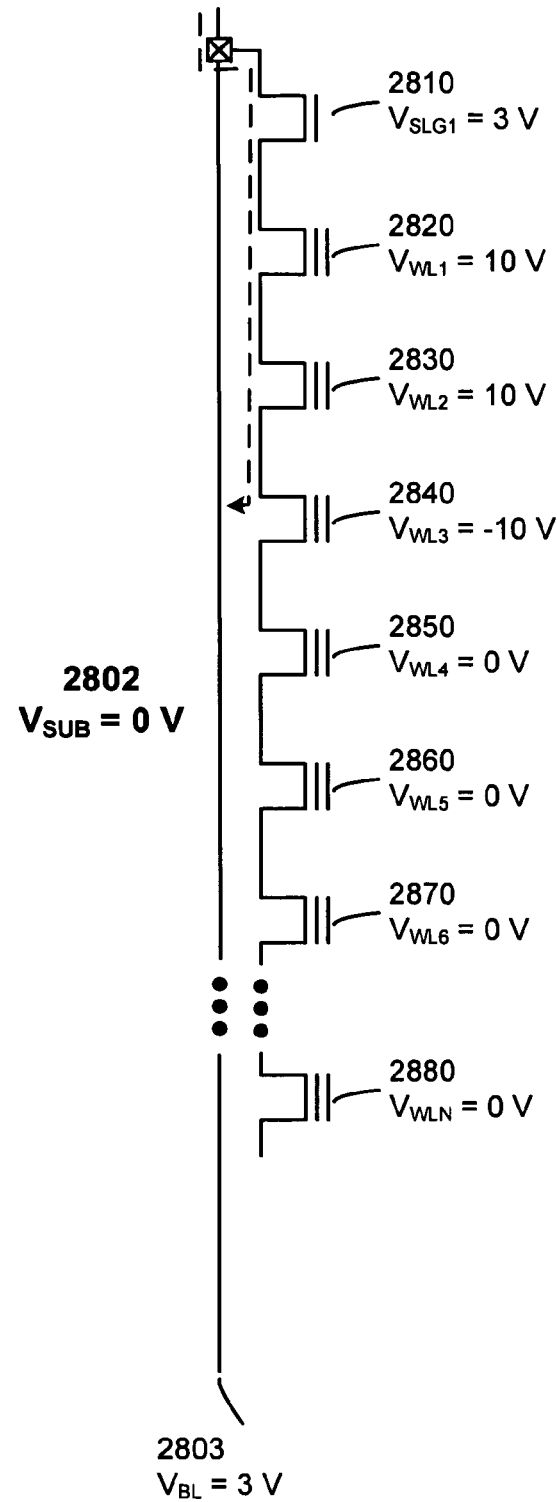
Fig. 34
Fig. 35

METHOD AND APPARATUS FOR OPERATING NONVOLATILE MEMORY CELLS IN A SERIES ARRANGEMENT

RELATED APPLICATIONS

The present application is related to U.S. patent application Ser. No. 11/191,365, filed Jul. 28, 2005; U.S. patent application Ser. No. 11/191,329, filed Jul. 28, 2005; and U.S. patent application Ser. No. 11/191,367, filed Jul. 28, 2005. The present application is a continuation-in-part of U.S. patent application Ser. No. 10/973,593, filed Oct. 26, 2004 and U.S. application Ser. No. 10/973,176 filed on Oct. 26, 2004 and now U.S. Pat. No. 7,170,785, issued Jan. 30, 2007, which claim the benefit of U.S. Provisional Application No. 60/608,455 filed Sep. 9, 2004 and U.S. Provisional Application No. 60/608,528 filed Sep. 9, 2004. All these applications are incorporated herein by reference.

BACKGROUND OF THE INVENTION

1. Field of the Invention

The present invention relates to electrically programmable and erasable non-volatile memory, and more particularly to charge storage memory with a bias arrangement that reads the contents of the charge storage structure of the memory cell with great sensitivity.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Various memory cell structures based on charge trapping dielectric layers include structures known by the industry names PHINES, NROM, and SONOS, for example. These memory cell structures store data by trapping charge in a charge trapping dielectric layer, such as silicon nitride. As more net negative charge is trapped, the threshold voltage of the memory cell increases. The threshold voltage of the memory cell is reduced by removing negative charge from, or adding positive charge to, the charge trapping layer.

Conventional memory cell structures rely on the reverse read operation to determine the contents of the memory structure. However, the reverse read technique effectively couples together multiple locations of the charge trapping structure, even when only a portion of the charge trapping structure contains data of interest. This dependence constrains the utility of using the charge trapping structure as nonvolatile memory, by narrowing the sensing window of currents measured from the reverse read technique. Less data are stored in the charge trapping structure than otherwise possible.

Power consumption is another area of potential improvement. Portable electronic devices such as music players, cell phones, and wireless devices, have a limited source of power available. The reverse read operation is a source of power drain contributing to power consumption. Similarly, such power consumption occurs in read operations that rely on contrasting levels of lateral current flow through a channel formed in the memory cell.

Thus, a need exists for a nonvolatile memory cell that can be read without suffering substantial coupling between multiple locations of the charge storage structure, even when only a portion of the charge storage structure contains data of interest. Alternately, a need exists for a read operation that reduces power consumption, compared to the reverse read operation.

SUMMARY OF THE INVENTION

A method of operating a nonvolatile memory array, an architecture for an integrated circuit including such a memory array, and an architecture for an integrated circuit including a column nonvolatile memory cells, are disclosed.

A nonvolatile memory integrated circuit includes a nonvolatile memory array storing data as charge storage states, bit lines, and word lines providing gate voltage. The nonvolatile memory array includes columns of memory cells. Each memory cell has a substrate region including first and second current carrying nodes, a charge storage structure, and one or more dielectric structures. The dielectric structure is positioned about the charge storage structure, such that the dielectric structure is interposed somewhere between the charge storage structure and the substrate region, and somewhere between the charge storage structure and the source of gate voltage.

The bit lines each have a corresponding column of memory cells, such that a particular bit line is used to access data on the corresponding column of memory cells. During some memory operation, a bit line is electrically connected to the first end of the corresponding column of memory cells. During some memory operation, the same bit line is electrically connected to the second end of the corresponding column of memory cells. For example, during a program operation, the same bit line is electrically connected to the first end and the second end of the corresponding column. In another example, during a read operation, the same bit line is electrically connected to the first end and the second end of the corresponding column. The read operation can be performed to determine at least one of the charge storage states by measuring a band-to-band current component.

In some embodiments additional memory operations are performed on the nonvolatile memory array. During these additional memory operations, a bit line is electrically connected to the first end of the corresponding column of nonvolatile memory cells, and the second end of the same column of nonvolatile memory cells floats.

In some embodiments, the substrate region is a well in a semiconductor substrate. In other embodiments, the substrate region is simply the semiconductor substrate.

Other embodiments of the technology described above include a method for operating the nonvolatile memory array, and a column of the nonvolatile memory according to the described technology.

Some embodiments include first pass transistors and second pass transistors. During some memory operation, a bit line is electrically connected to the first end of the corresponding column of memory cells via a first pass transistor. During some memory operation, the same bit line is electrically connected to the second end of the corresponding column of memory cells via a second pass transistor.

In one embodiment, the nonvolatile memory cell has a split gate design, and includes a second gate. In memory operations, the different gates each apply a potential to the substrate region. With this split gate design, the logic applies erase and programming bias arrangements to change the charge storage state by injecting electrons into and ejecting electrons from corresponding parts of the charge storage structures.

In other embodiments, the nonvolatile memory cell has a floating gate design or a nanocrystal design. With this floating gate design or nanocrystal design, the logic applies erase and programming bias arrangements to change the charge storage state by injecting electrons into and ejecting electrons from corresponding parts of the charge storage structures.

In another embodiments, the nonvolatile memory cell has a charge trapping material design. With this charge trapping material design, the logic applies erase and programming bias arrangements to change the charge storage state by injecting electrons into and injection holes into corresponding parts of the charge storage structures.

During a read operation, the measured current flowing between the first current carrying node and/or the second current carrying node, and the substrate region, includes a band-to-band tunneling current, flowing between the substrate region and at least one of the first current carrying node and/or the second current carrying node to determine the charge storage state. To induce the measured current flowing between the first current carrying node and/or the second current carrying node, and the substrate region, the read bias arrangement causes a first voltage difference between the gate and the first current carrying node and/or the second current carrying node, and a second voltage difference between the first current carrying node and/or the second current carrying node and the substrate region.

Because the read operation does not require a current to flow between the first and second current carrying nodes of the measured nonvolatile memory cells, the read bias arrangement allows for one region of the first and second current carrying regions to be floated, while the other region of the first and second current carrying regions is biased to have a voltage difference with the substrate region.

The measured current flowing between the first and/or second current carrying regions, and the substrate region, includes a band-to-band tunneling current, flowing between the substrate region and at least one of the first and second current carrying regions to determine the charge storage state. To induce the measured current flowing between the first and/or second current carrying regions, and the substrate region, the read bias arrangement causes a first voltage difference between the gate and the first and/or second current carrying regions, and a second voltage difference between the first and/or second current carrying regions and the substrate region.

The voltage difference between the gate and at least one of the first and second current carrying regions creates an electric field which causes band bending in the same region (s). The degree of band bending is affected by the charge storage state of the charge trapping structure, resulting in a band-to-band tunneling current in at least one of the first and second current carrying regions that varies with the charge storage state. In some embodiments, the bias arrangement applies a reverse bias voltage difference between the substrate region and the first or second current carrying regions, and floats the other of the first or second current carrying region.

In some embodiments, the substrate region is a well in a semiconductor substrate. In other embodiments, the substrate region is simply the semiconductor substrate.

Other embodiments of the technology described above include a column of nonvolatile memory cells according to the described technology, and a method of operating the column.

Other aspects and advantages of the technology presented herein can be understood with reference to the figures, the detailed description and the claims, which follow.

Various embodiments include memory cells with an n-type channel, memory cells with a p-type channel, or memory cells with an n-type channel and memory cells with a p-type channel.

BRIEF DESCRIPTION OF THE DRAWINGS

FIG. 28 is a diagram of an erase operation via one bias arrangement being performed on nonvolatile memory cells interconnected as a column of cells arranged in series with a floating end.

FIG. 29 is a diagram of an erase operation via another bias arrangement being performed on nonvolatile memory cells interconnected as a column of cells arranged in series with a floating end.

FIG. 30 is a diagram of a program operation being performed on nonvolatile memory cells interconnected as a column of cells arranged in series.

FIG. 31 is a diagram of a program operation being performed on nonvolatile memory cells interconnected as a column of cells arranged in series with a floating end.

FIG. 34 is a diagram of a read operation being performed on nonvolatile memory cells interconnected as a column of cells arranged in series, via both ends of the series.

FIG. 35 is a diagram of a read operation being performed on nonvolatile memory cells interconnected as a column of cells arranged in series with a floating end.

DETAILED DESCRIPTION

Figure 1A:
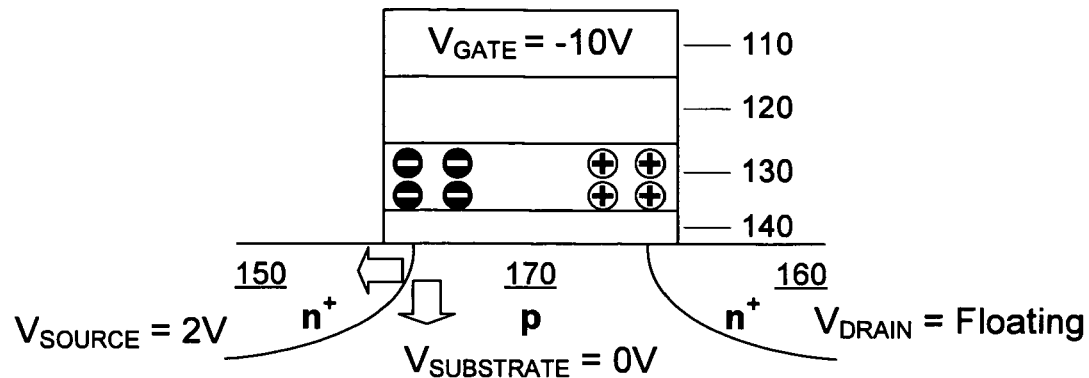
FIG. 1A is a simplified diagram of a charge trapping memory cell, showing a read operation being performed on the portion of the charge trapping structure corresponding to the source side.

FIG. 1A is a simplified diagram of a charge trapping memory cell, showing a read operation being performed on the portion of the charge trapping structure corresponding to the source side. The p-doped substrate region 170 includes n+ doped source and drain regions 150 and 160. The remainder of the memory cell includes a bottom dielectric structure 140 on the substrate, a charge trapping structure 130 on the bottom dielectric structure 140 (bottom oxide), a top dielectric structure 120 (top oxide) on the charge trapping structure 130, and a gate 110 on the oxide structure 120. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others.

The memory cell for SONOS-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers. Other charge trapping memory cells are PHINES and NROM.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 1A, the source side of the memory cell stores added electrons, for example via a channel reset operation injecting electrons via Fowler-Nordheim tunneling from the gate 110 or the substrate 170, or some other charge movement process such as channel hot electron injection or channel initiated secondary electron injection. The drain side of the memory cell stores added holes, for example via band-to-band hole injection into the drain side of the charge trapping structure 130.

Figure 1B:
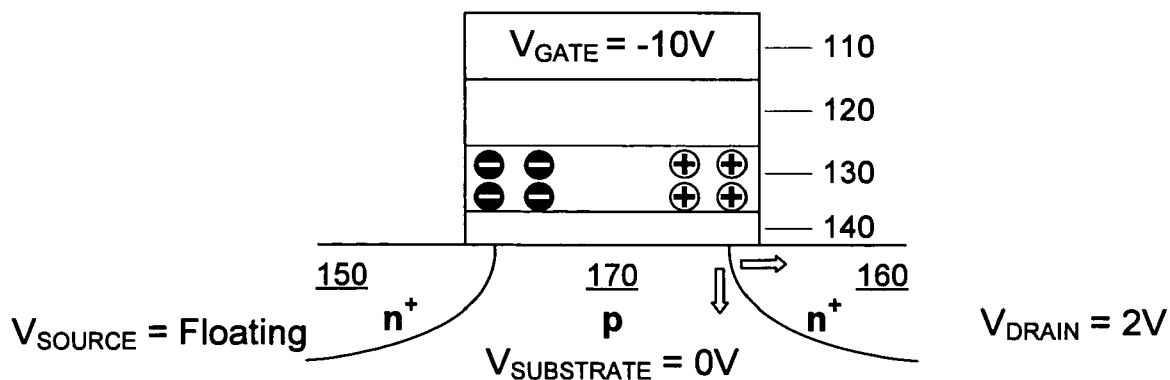
FIG. 1B is a simplified diagram of a charge trapping memory cell, showing a read operation being performed on the portion of the charge trapping structure corresponding to the drain side.

In the bias arrangement of FIG. 1A for reading the source side of the charge trapping structure 130, the voltage of the gate 110 is −10 V, the voltage of the source 150 is 2 V, the voltage of the drain 160 is floating, and the voltage of the substrate 170 is 0 V. The memory cell of FIG. 1B is similar to memory cell of FIG. 1A, except that a read operation is being performed on the drain side of the charge trapping structure rather than on the source side. In the bias arrangement of FIG. 1B for reading the drain side of the charge trapping structure 130, the voltage of the gate 110 is −10 V, the voltage of the source 150 is floating, the voltage of the drain 160 is 2 V, and the voltage of the substrate 170 is 0 V. The bias arrangement is determined among the various terminals, such that the energy bands bend sufficiently to cause band-to-band current in the n+ doped source 150 (FIG. 1A) or the n+ doped drain 160 (FIG. 1B), but to keep the potential difference between the substrate 170 and the source 150 (FIG. 1A) or the drain 160 (FIG. 1B) low enough such that programming or erasing does not occur, as discussed in connection with FIG. 3A, 3B, 4A, 4B, 7A, and 7B.

In this bias arrangements of FIGS. 1A and 1B, the area of the junction between the p doped substrate 170, and either the n+ doped source 150 or the n+ doped drain 160, displays the behavior of a reverse biased p-n junction. However, the gate voltage causes the energy bands to bend sufficiently such that band-to-band tunneling occurs through the n+ doped source 150 (FIG. 1A) or the n+ doped drain 160 (FIG. 1B). The high doping concentration in the source 150 or the drain 160, the resulting high charge density of the space charge region, and the accompanying short length of the space charge region over which the voltage changes, contribute to the sharp energy band bending. Electrons in the valence band tunnel through the forbidden gap to the conduction band and drift down the potential hill, deeper into either the n+ doped source 150 (FIG. 1A) or the n+ doped drain 160 (FIG. 1B). Similarly, holes drift up the potential hill, away from either the n+ doped source 150 (FIG. 1A) or the n+ doped drain 160 (FIG. 1B), and toward the p doped substrate 170.

The voltage of the gate 110 controls the voltage of the portion of the substrate 170 by the bottom dielectric structure 140 (bottom oxide). In turn, the voltage of the portion of the substrate 170 by the bottom dielectric structure 140 (bottom oxide) controls the degree of band bending between the bottom dielectric structure 140 (bottom oxide), and either the n+ doped source 150 (FIG. 1A) or the n+ doped drain 160 (FIG. 1B). As the voltage of the gate 110 becomes more negative, the voltage of the portion of the substrate 170 by the bottom dielectric structure 140 (bottom oxide) becomes more negative, resulting in deeper band bending in either the n+ doped source 150 (FIG. 1A) or the n+ doped drain 160 (FIG. 1B). More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of semiconductor Devices*, 1981).

As mentioned above, the drain side of the charge trapping structure 130 is occupied by relatively more holes, whereas the source side of the charge trapping structure 130 is occupied by relatively more electrons than the drain side of the charge trapping structure 130. As a result, in accordance with Gauss's Law, when −10 V is applied to the gate 110, the bottom dielectric structure 140 (bottom oxide) is biased more negatively on the source side than on the drain side. Thus, more current flows between the source 150 and the substrate 170 in the bias arrangement shown in FIG. 1A for reading the source side of the charge trapping structure 130 than flows between the drain 160 and the substrate 170 in the bias arrangement shown in FIG. 1B for reading the drain side of the charge trapping structure 130.

The difference in the bias arrangements of FIGS. 1A and 1B for reading, and the bias arrangement of FIGS. 3A, 3B, 4A, and 4B for programming and erasing, show a careful balance. For reading, the potential difference between the source region and the drain region should not cause a substantial number of carriers to transit the tunnel oxide and affect the charge storage state. In contrast, for programming and erasing, the potential difference between the source region and the drain region is sufficient to cause a substantial number of carriers to transit the tunnel oxide and affect the charge storage state.

Figure 2A:
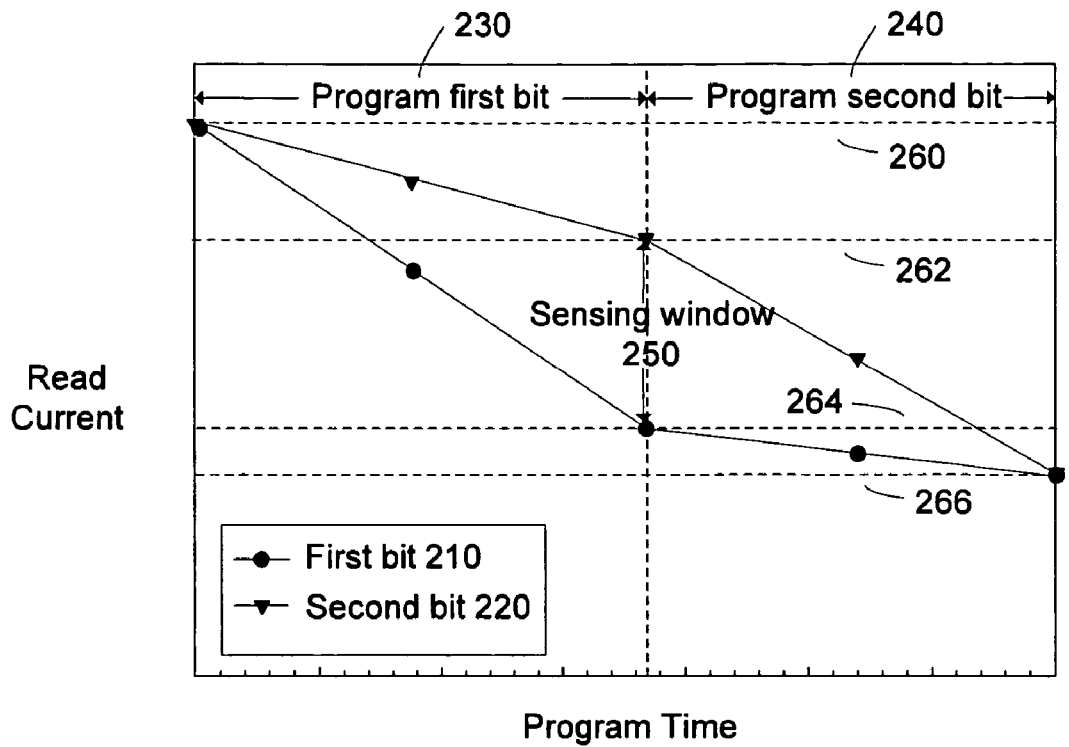
FIG. 2A is a graph showing the sensing window of a typical nonvolatile memory cell.

FIG. 2A is a graph showing the sensing window of a typical nonvolatile memory cell. In FIG. 2A, the memory cell read by a reverse read operation has a relatively narrow sensing window 250 due to the second bit effect. During the time interval 230, as the first bit is undergoing programming, the read current curve of the first bit 210 increases from a lowest level 260 to a high level 264. Consequently, the programming of the first bit during the time interval 230 substantially affects the read current curve of the second bit 220, which increases from a lowest level 260 to a low level 262. During the time interval 240, as the second bit is undergoing programming, the read current curve of the second bit 220 increases from a low level 262 to a highest level 266. Consequently, the programming of the second bit during the time interval 240 substantially affects the read current curve of the first bit 210, which increases from a high level 264 to a highest level 266. Thus, when performing a reverse read operation on a memory cell on one bit, the resulting read current is substantially affected by the programmed or erased status of the other bit, because for a given gate voltage it becomes more difficult during the reverse read operation to force the substrate portion under the other bit into depletion and inversion, and to punch through the portion of the substrate under the other bit.

Figure 2B:
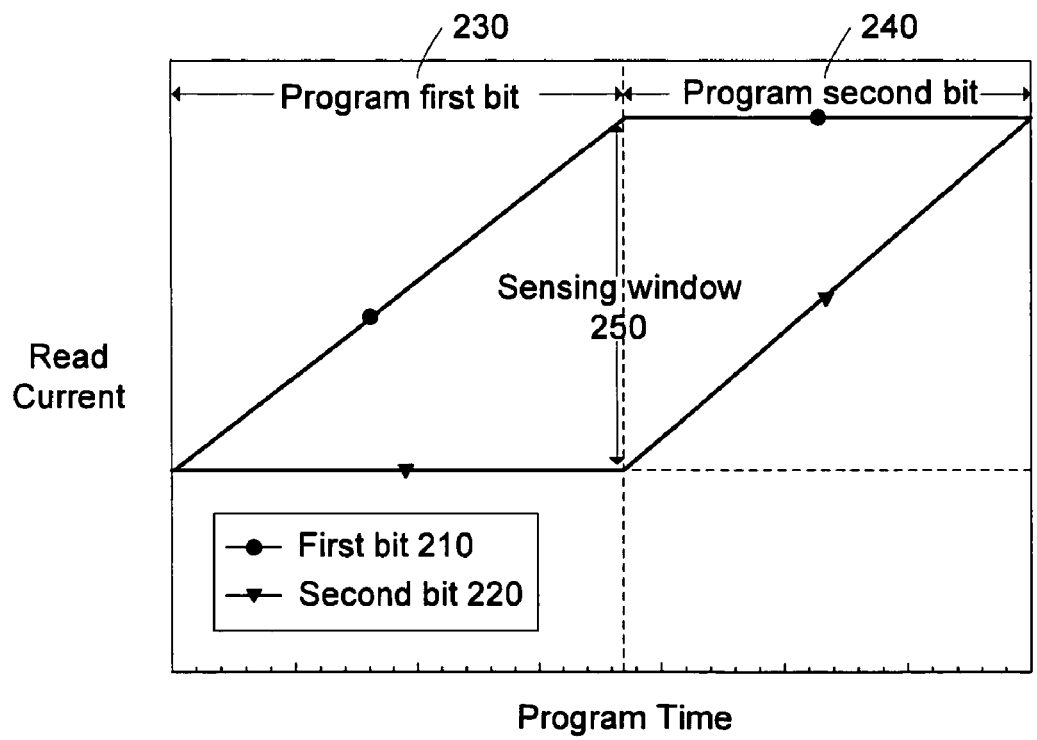
FIG. 2B is a graph showing the sensing window of a memory cell as a program operation is performed on different parts of the charge trapping structure of the memory cell.

FIG. 2B is a graph showing the sensing window of a memory cell as a program operation is performed on different parts of the charge trapping structure of the memory cell. In the graph of FIG. 2B, the first and second charge trapping parts undergo programming. Curve 210 represents the read current of the first charge trapping part. Curve 220 represents the read current of the second charge trapping part. The sensing window 250 shown in FIG. 2B is relatively wide, because the band-to-band read operation is local to either the first terminal or the second terminal. The read current resulting from a band-to-band read operation performed on the first charge trapping part is relatively insensitive to the logical state of the second charge trapping part, and the read current resulting from a band-to-band read operation performed on the second charge trapping part is relatively insensitive to the logical state of the first charge trapping part. The band-to-band read operation is relatively free of the second charge trapping part effect which characterizes the reverse read operation, where the read current resulting from a read operation performed on one side of the charge trapping structure is relatively dependent on the data stored on the other side of the charge trapping structure.

Each charge trapping part can store one bit or multiple bits. For example, if each charge trapping part stores two bits, then there are four discrete levels of charge.

Figure 3A:
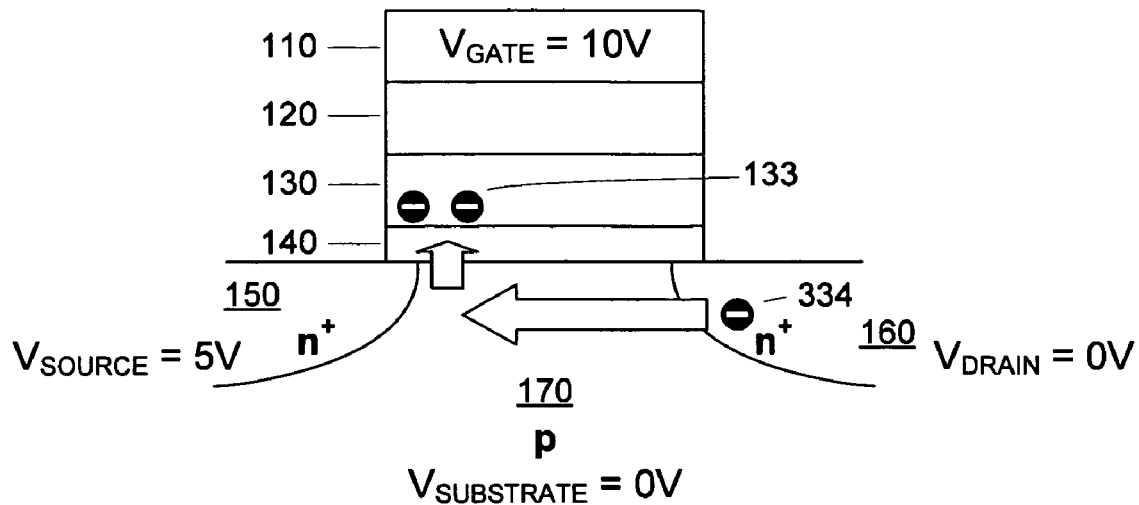
FIG. 3A is a simplified diagram of a charge trapping memory cell, showing channel hot electron injection being performed on one portion of the charge trapping structure.
Figure 3B:
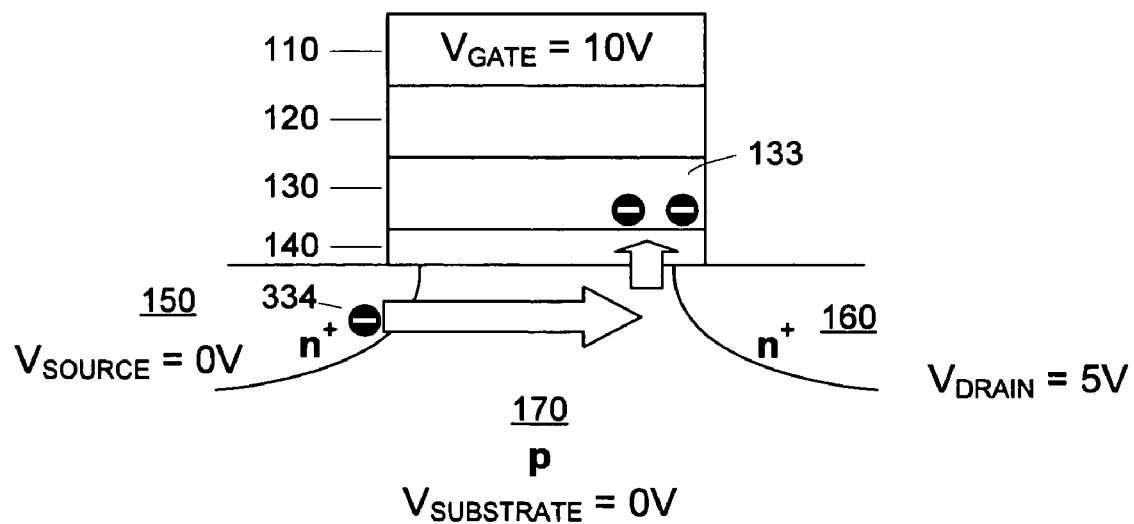
FIG. 3B is a simplified diagram of a charge trapping memory cell, showing channel hot electron injection being performed on another portion of the charge trapping structure.

FIGS. 3A and 3B are simplified diagrams of a charge trapping memory cell, showing channel hot electron injection being performed on different portions of the charge trapping structure. In the bias arrangement of FIG. 3A for adding electrons 134 to the source side of the charge trapping structure 130, the voltage of the gate 110 is 10 V, the voltage of the source 150 is 5 V, the voltage of the drain 160 is 0 V, and the voltage of the substrate 170 is 0 V. The memory cell of FIG. 3B is similar to memory cell of FIG. 3A, except that electrons 134 are added to the drain side of the charge trapping structure rather than on the source side. In the bias arrangement of FIG. 3B, the voltage of the gate 110 is 10 V, the voltage of the source 150 is 0 V, the voltage of the drain 160 is 5 V, and the voltage of the substrate 170 is 0 V.

Figure 4A:
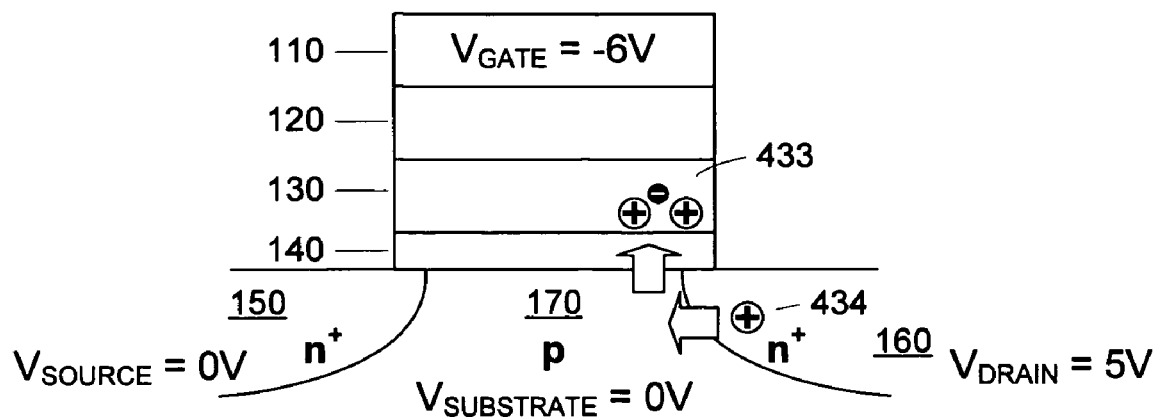
FIG. 4A is a simplified diagram of a charge trapping memory cell, showing band to band hot hole injection being performed on one portion of the charge trapping structure.
Figure 4B:
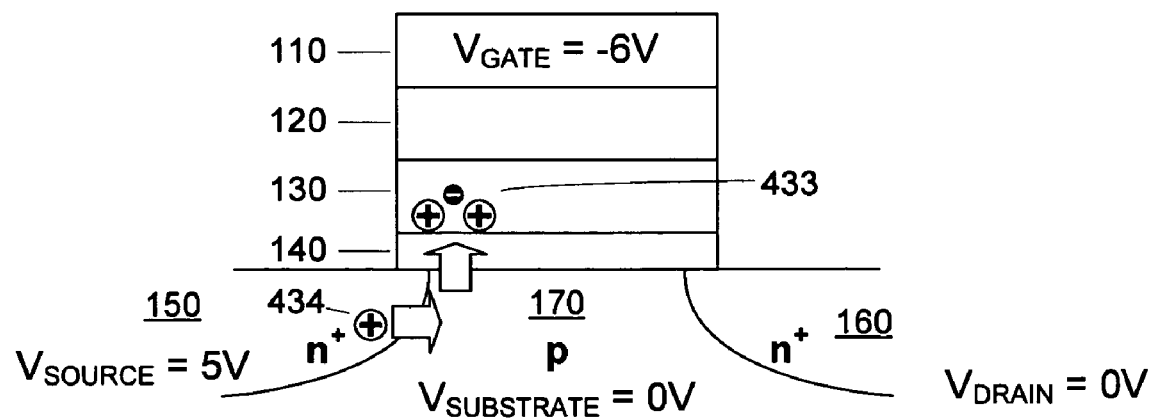
FIG. 4B is a simplified diagram of a charge trapping memory cell, showing band to band hot hole injection being performed on another portion of the charge trapping structure.

FIGS. 4A and 4B are simplified diagrams of a charge trapping memory cell, showing band to band hot hole injection being performed on different portions of the charge trapping structure. In the bias arrangement of FIG. 4A for adding holes 433 to the drain side of the charge trapping structure 130, the voltage of the gate 110 is –6 V, the voltage of the source 150 is 0 V, the voltage of the drain 160 is 5 V, and the voltage of the substrate 170 is 0 V. The memory cell of FIG. 4B is similar to memory cell of FIG. 4A, except that holes 433 are added to the drain side of the charge trapping structure rather than on the source side. In the bias arrangement of FIG. 4B, the voltage of the gate 110 is –6 V, the voltage of the source 150 is 5 V, the voltage of the drain 160 is 0 V, and the voltage of the substrate 170 is 0 V. In the simplified diagrams of FIGS. 4A and 4B, the stored charge 433 in the charge trapping structure, electrons are symbolically shown smaller than the holes to show that the injected holes have erased previously programmed holes.

In some embodiments, programming refers to making more positive the net charge stored in the charge trapping structure, such as by the addition of holes to or the removal of electrons from the charge trapping; and erasing refers to making more negative the net charge stored in the charge trapping structure, such as by the removal of holes from or the addition of electrons to the charge trapping structure. However, in other embodiments programming refers to making the net charge stored in the charge trapping structure more negative, and erasing refers to making the net charge stored in the charge trapping structure more positive. Various charge movement mechanisms are sued, such as band-to-band tunneling induced hot carrier injection, E-field induced tunneling, channel hot carrier injection, channel initiated substrate carrier injection, and direct tunneling from the substrate.

Figure 5:
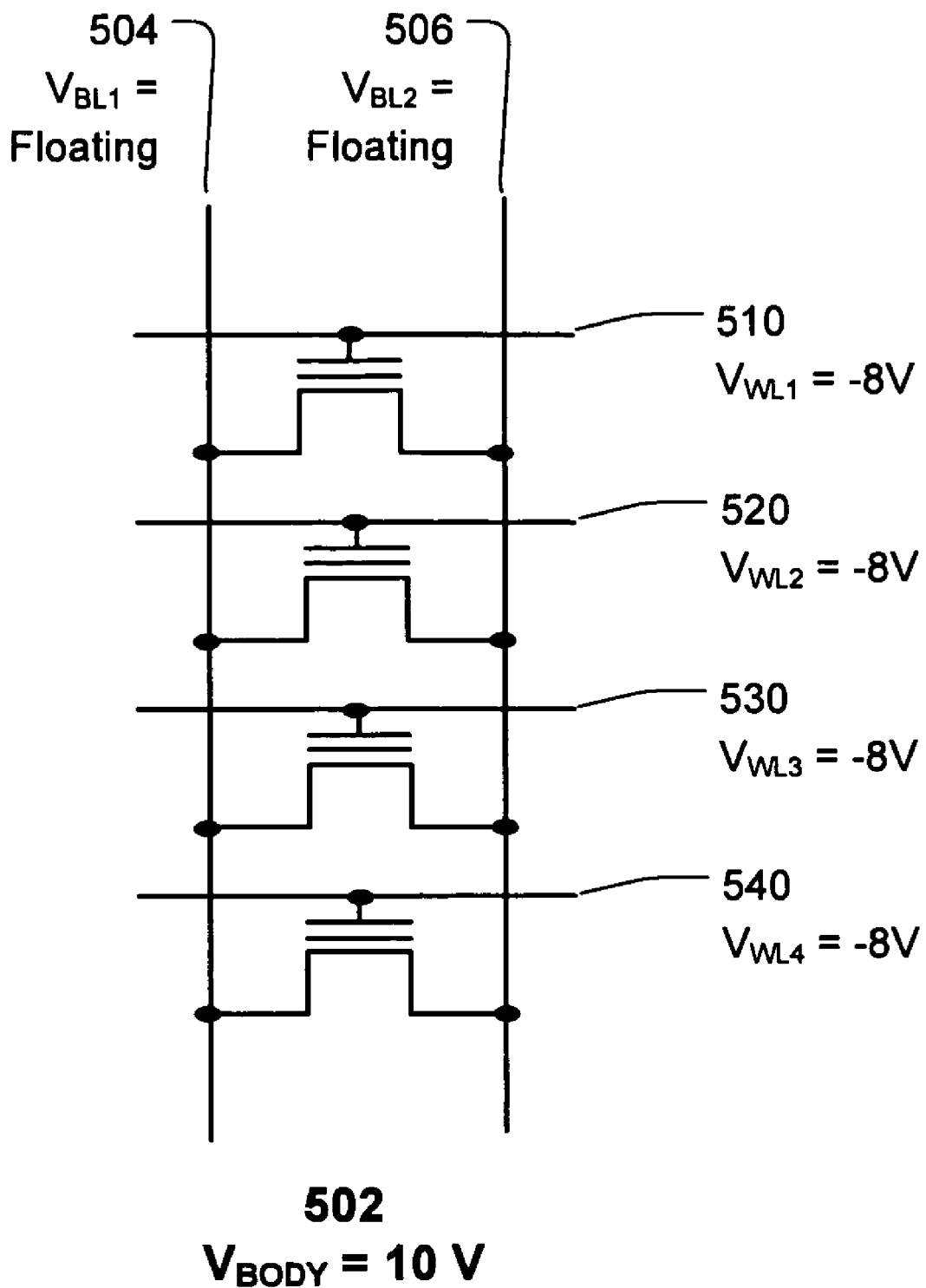
FIG. 5 is a diagram of an erase operation via one bias arrangement being performed on a column of nonvolatile memory cells interconnected in a NOR arrangement.
Figure 6:
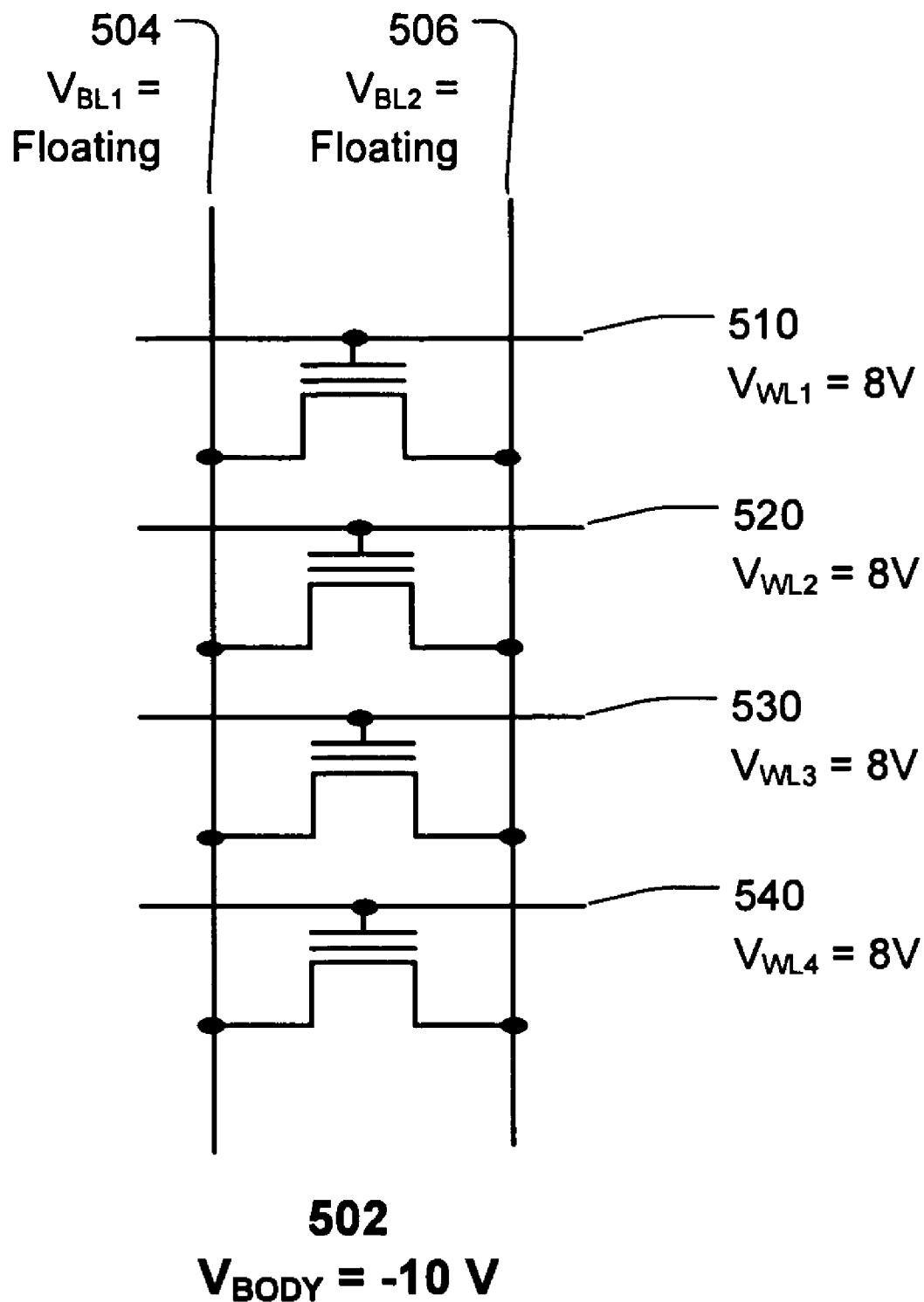
FIG. 6 is a diagram of an erase operation via another bias arrangement being performed on a column of nonvolatile memory cells interconnected in a NOR arrangement.

FIGS. 5 and 6 are diagrams of an erase operation being performed on a column of nonvolatile memory cells interconnected in a NOR arrangement. In the bias arrangement of FIG. 5 for erasing the NOR memory column, the voltages of the word lines 510, 520, 530, and 540 are –8 V; the voltage of the bit lines 504 and 506 are floating, and the voltage of the substrate 502 is 10 V. In the bias arrangement of FIG. 6 for erasing the NOR memory column, the voltages of the word lines 510, 520, 530, and 540 are 8 V; the voltage of the bit lines 504 and 506 are floating, and the voltage of the substrate 502 is –10 V. The bias arrangements of FIGS. 5 and 6 differ in that the electrons tunnel in an overall direction from the gate to the substrate in FIG. 5, and from the substrate to the gate in FIG. 6.

Figure 7A:
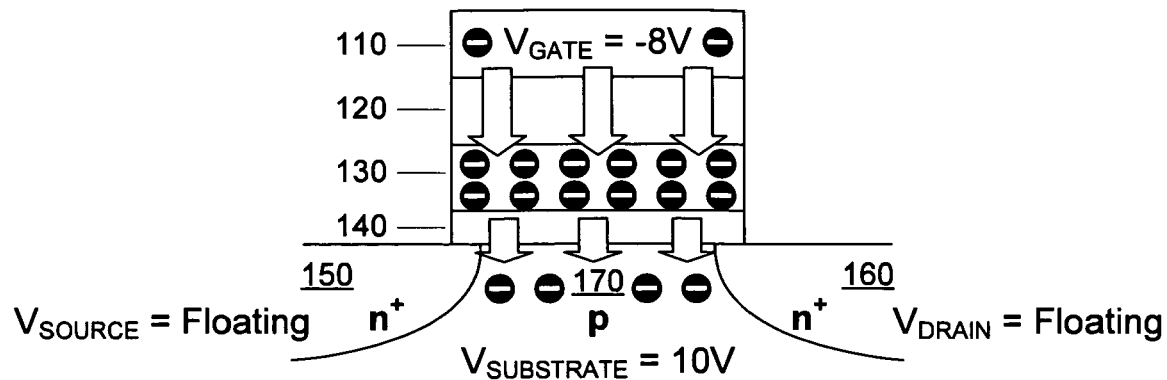
FIG. 7A is a simplified diagram of a charge trapping memory cell, showing an erase operation being performed on the charge trapping structure, corresponding to FIG. 5.
Figure 7B:
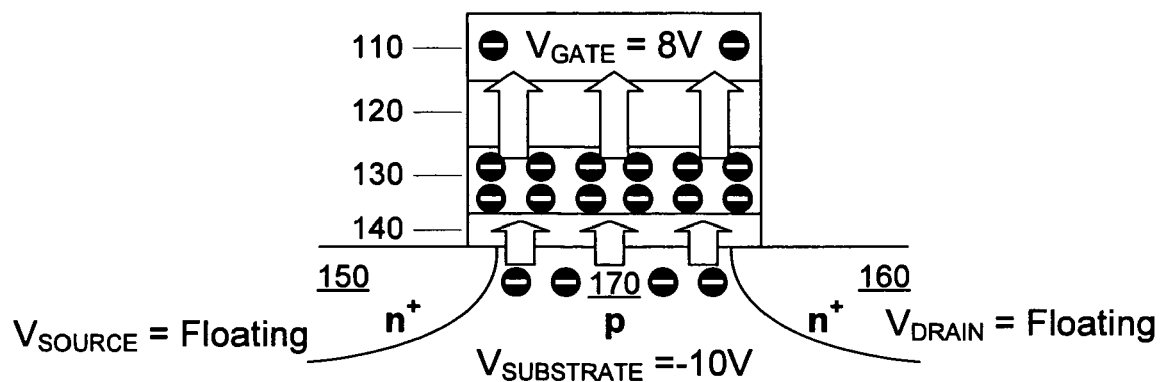
FIG. 7B is a simplified diagram of a charge trapping memory cell, showing an erase operation being performed on the charge trapping structure, corresponding to FIG. 6.

FIGS. 7A and 7B are simplified diagrams of a charge trapping memory cell, showing an erase operation being performed on the charge trapping structure, corresponding to FIGS. 5 and 6. In the bias arrangement of FIG. 7A for erasing the memory cell, the voltage of the gate 110 is –8 V, the voltage of the source 150 and the drain 160 is floating, and the voltage of the substrate 170 is 10 V. The erase operation of FIG. 7A corresponds to the erase operation on the NOR memory column of FIG. 5. The memory cell of FIG. 7B is similar to memory cell of FIG. 7A, except for the direction of movement of the electrons. In the bias arrangement of FIG. 7B, the voltage of the gate 110 is 8 V, the voltage of the source 150 and the drain 160 is floating, and the voltage of the substrate 170 is –10 V. The erase operation of FIG. 7B corresponds to the erase operation on the NOR-connected memory column of FIG. 6. The erase operations of FIGS. 7A and 7B, and the electron injection operation of FIGS. 3A and 3B are alternative electron movement mechanisms.

Figure 8:
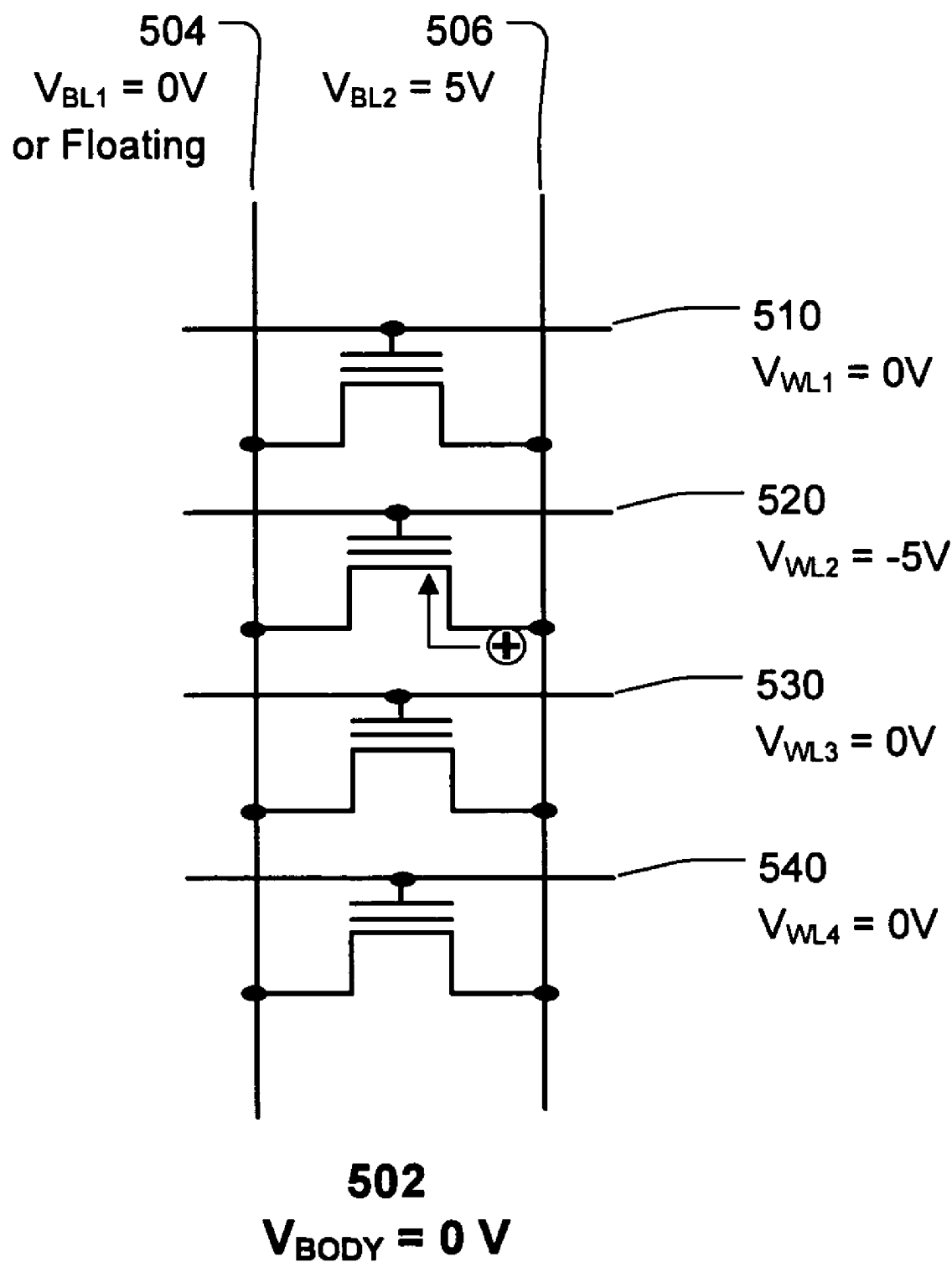
FIG. 8 is a diagram of a program operation being performed on a column of nonvolatile memory cells interconnected in a NOR arrangement, adding holes to one part of a memory cell.
Figure 9:
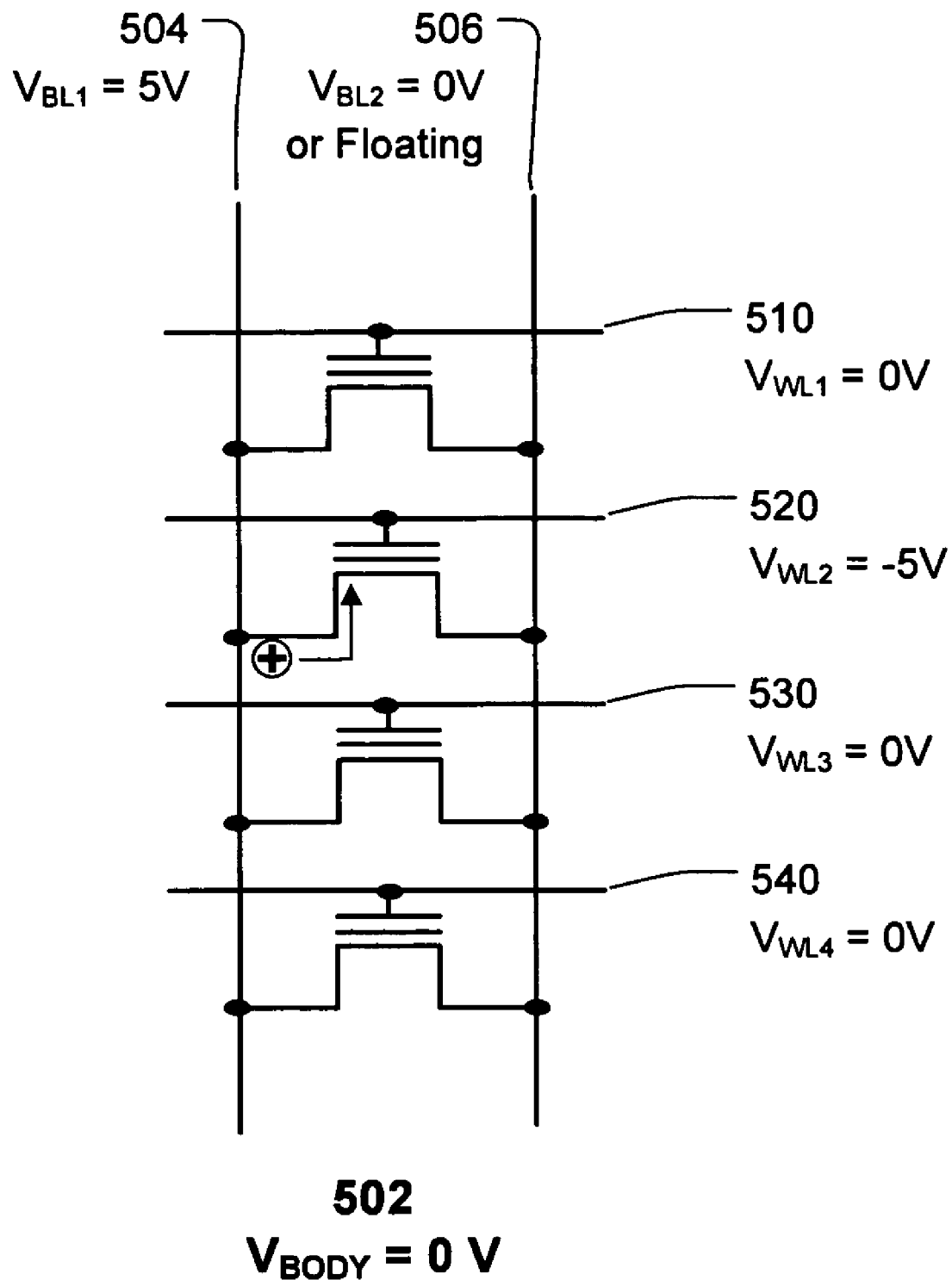
FIG. 9 is a diagram of a program operation being performed on a column of nonvolatile memory cells interconnected in a NOR arrangement, adding holes to another part of a memory cell.

FIGS. 8 and 9 are diagrams of a program operation being performed on a column of nonvolatile memory cells interconnected in a NOR arrangement. In the bias arrangement of FIG. 8, the voltage of the word lines 510, 530, 540 are 0 V; the voltage of the word line 520 is –5 V; the voltage of the bit line 504 is floating or 0 V; the voltage of the bit line 506 is 5 V; and the voltage of the substrate 502 is 0 V. A hole is symbolically shown being programmed from the bit line 506 into the memory cell controlled by word line 520. In the bias arrangement of FIG. 9, the voltages of the bit lines 504 and 506 are switched, such that the voltage of the bit line 504 is floating or 0 V, and the voltage of the bit line 506 is 5 V. A hole is symbolically shown being programmed from the bit line 504 into the memory cell controlled by word line 520. Thus, the bias arrangement of the bit lines controls the portion of the charge trapping structure that is programmed for a particular memory cell. The operation to add holes to a single cell of FIGS. 4A and 4B is similar to the program operation being performed on the NOR-connected memory column of FIGS. 8 and 9.

Figure 10:
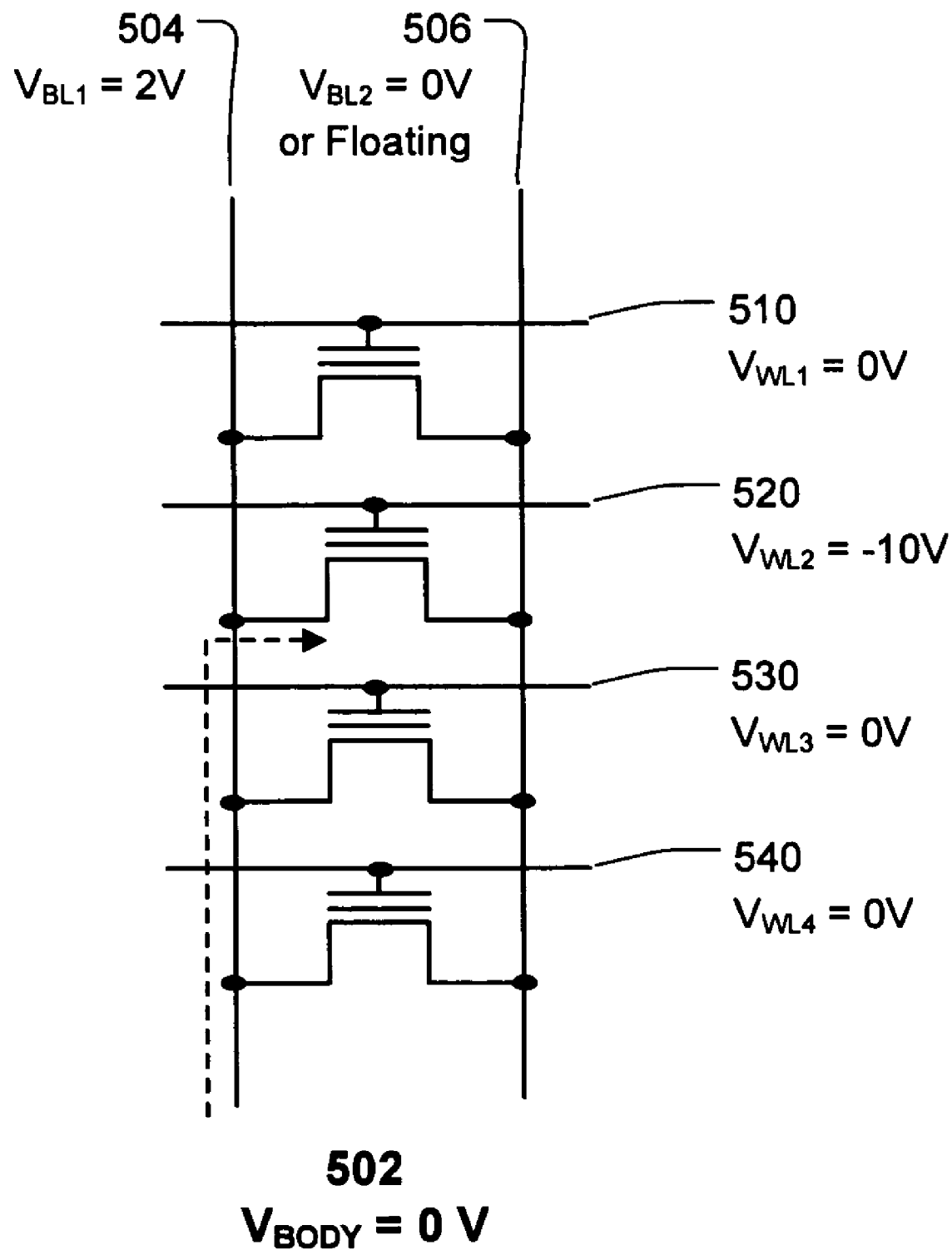
FIG. 10 is a diagram of a read operation being performed on a column of nonvolatile memory cells interconnected in a NOR arrangement, reading one part of a memory cell.
Figure 11:
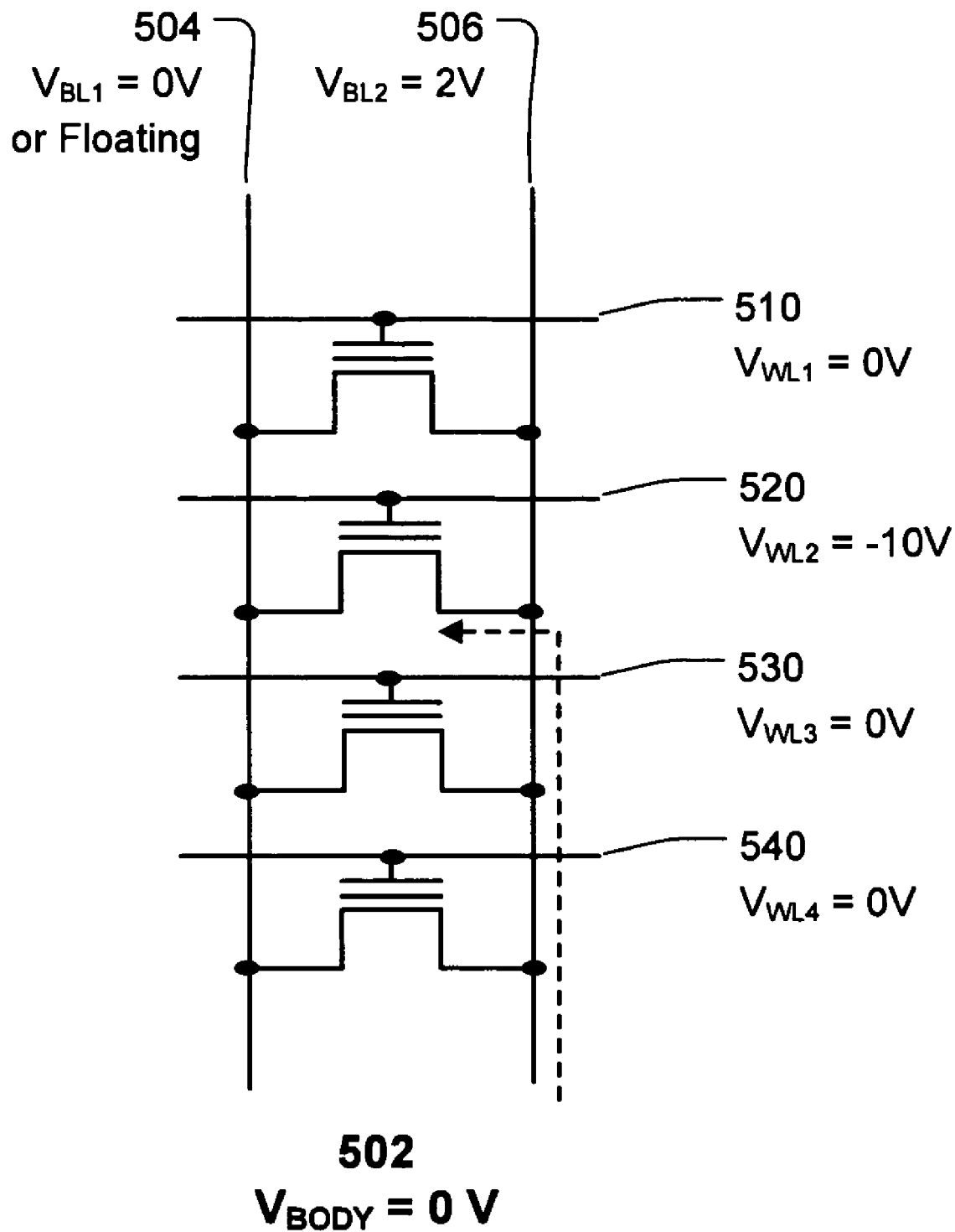
FIG. 11 is a diagram of a read operation being performed on a column of nonvolatile memory cells interconnected in a NOR arrangement, reading another part of a memory cell.

FIGS. 10 and 11 are diagrams of a read operation being performed on a column of nonvolatile memory cells interconnected in a NOR arrangement. In the bias arrangement of FIG. 10, the voltage of the word lines 510, 530, 540 are 0 V; the voltage of the word line 520 is –10 V; the voltage of the bit line 504 is 2 V; the voltage of the bit line 506 is floating or 0 V; and the voltage of the substrate 502 is 0 V. A current is symbolically shown flowing from the bit line 504, through the node of the memory cell controlled by word line 520, and into the substrate 502. In the bias arrangement of FIG. 11, the voltages of the bit lines are switched, such that the voltage of the bit line 504 is floating or 0 V, and the voltage of the bit line 506 is 2 V. A current is symbolically shown flowing from the bit line 506, through the node of the memory cell controlled by word line 520, and into the substrate 502. Thus, the bias arrangement of the bit lines controls the portion of the charge trapping structure that is read for a particular memory cell. The read operation being performed on the single cell of FIGS. 1A and 1B is similar to the read operation being performed on the NOR-connected memory column of FIGS. 10 and 11.

Figure 12:
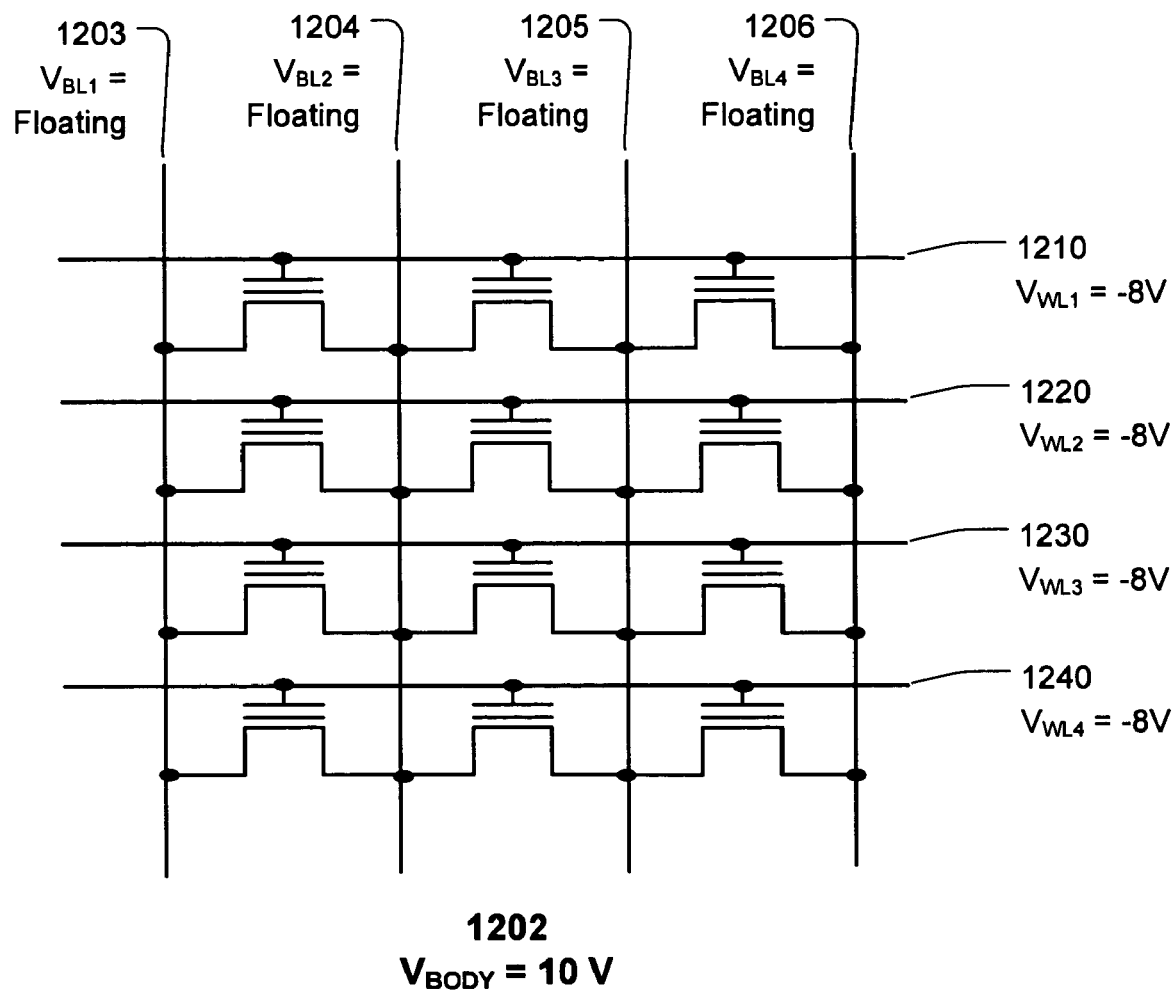
FIG. 12 is a diagram of an erase operation via one bias arrangement being performed on nonvolatile memory cells interconnected in a virtual ground array arrangement.
Figure 13:
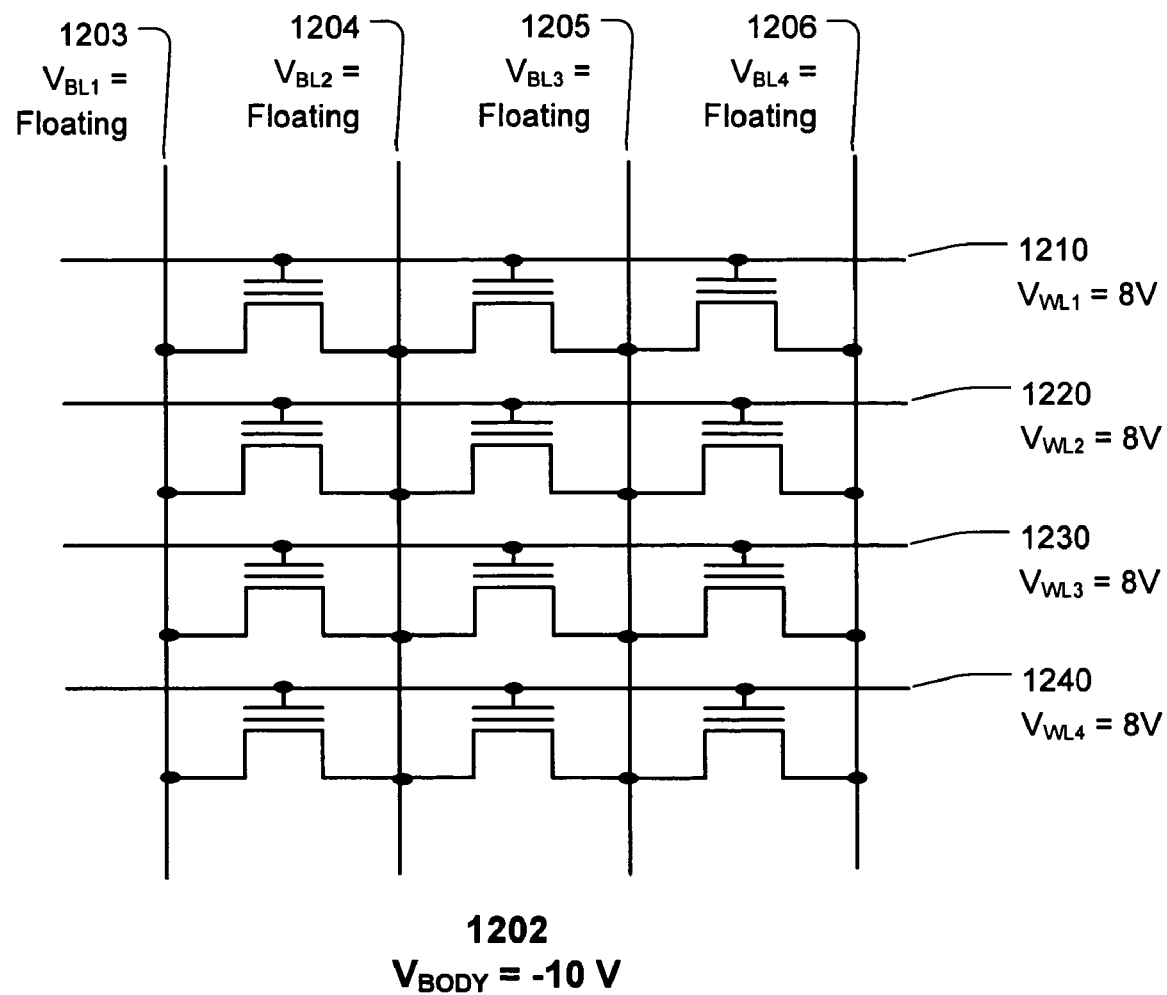
FIG. 13 is a diagram of an erase operation via another bias arrangement being performed on nonvolatile memory cells interconnected in a virtual ground array arrangement.

FIGS. 12 and 13 are diagrams of an erase operation being performed on nonvolatile memory cells interconnected in a virtual ground array arrangement. In the bias arrangement of FIG. 12, the voltage of the word lines 1210, 1220, 1230, and 1240 are −8 V; the voltage of the bit lines 1203, 1204, 1205, and 1206 is floating; and the voltage of the substrate 1202 is 10 V. The virtual ground array of FIG. 13 is similar to the virtual ground array of FIG. 12, except for the direction of movement of the electrons. In the bias arrangement of FIG. 13, the voltage of the word lines 1210, 1220, 1230, and 1240 are 8 V; the voltage of the bit lines 1203, 1204, 1205, and 1206 is floating; and the voltage of the substrate 1202 is −10 V. The erase operation of FIG. 7A corresponds to the erase operation on the virtual ground array of FIG. 12. The erase operation of FIG. 7B corresponds to the erase operation on the virtual ground array of FIG. 13.

Figure 14:
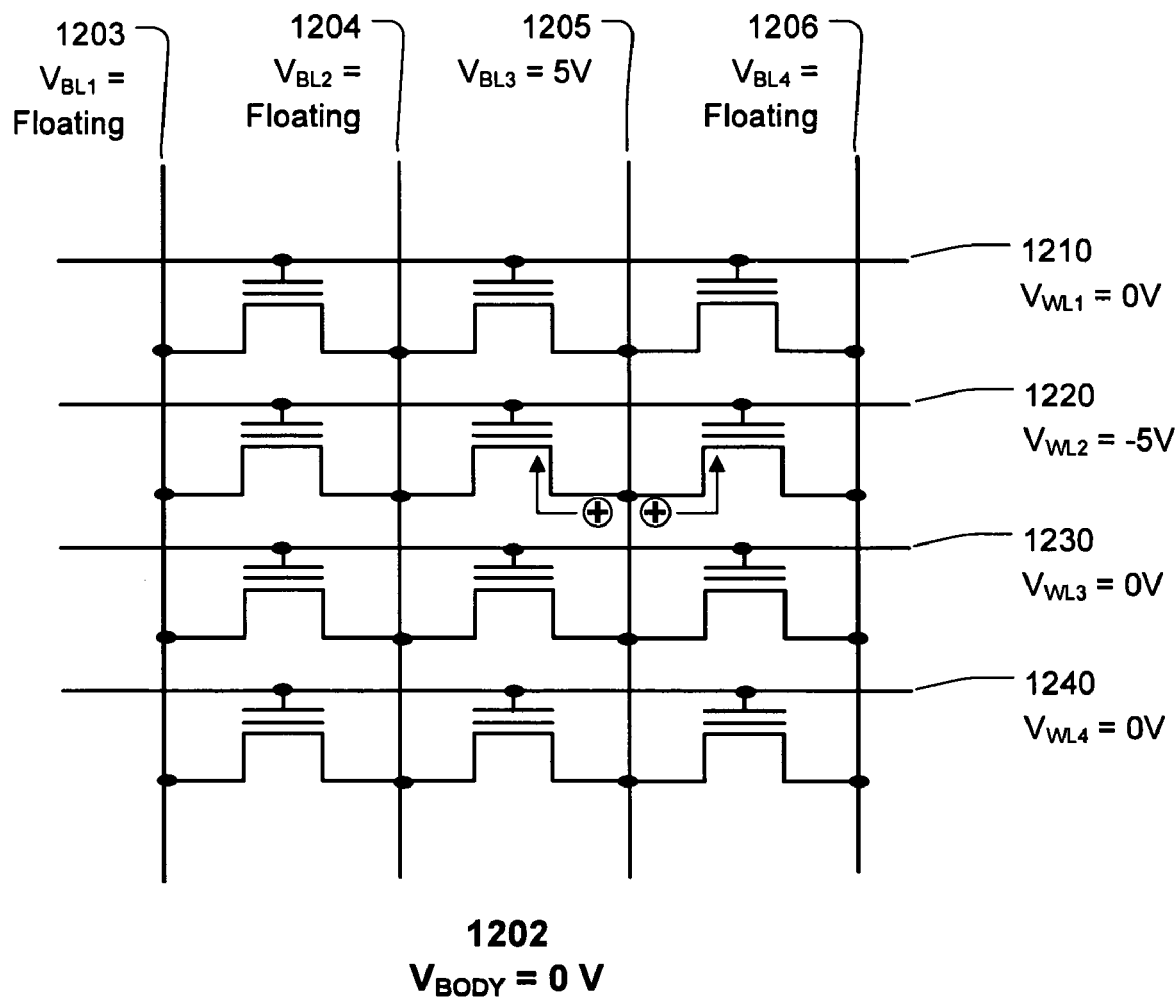
FIG. 14 is a diagram of a program operation being performed on a virtual ground array arrangement of non-volatile memory cells, adding holes to a part of the virtual ground array.

FIG. 14 is a diagram of a program operation being performed on a virtual ground array arrangement of nonvolatile memory cells. In the bias arrangement of FIG. 14, the voltage of the word lines 1210, 1230, and 1240 are 0 V; the voltage of the word line 1220 is −5 V; the voltage of the bit lines 1203, 1204 and 1206 is floating; the voltage of the bit line 1206 is 5 V; and the voltage of the substrate 1202 is 0 V. Holes are symbolically shown being programmed from the bit line 1205 into the parts of the memory cells controlled by word line 1220 and bit line 1205. The operation to add holes of FIGS. 4A and 4B is similar to the program operation of FIG. 14.

Figure 15:
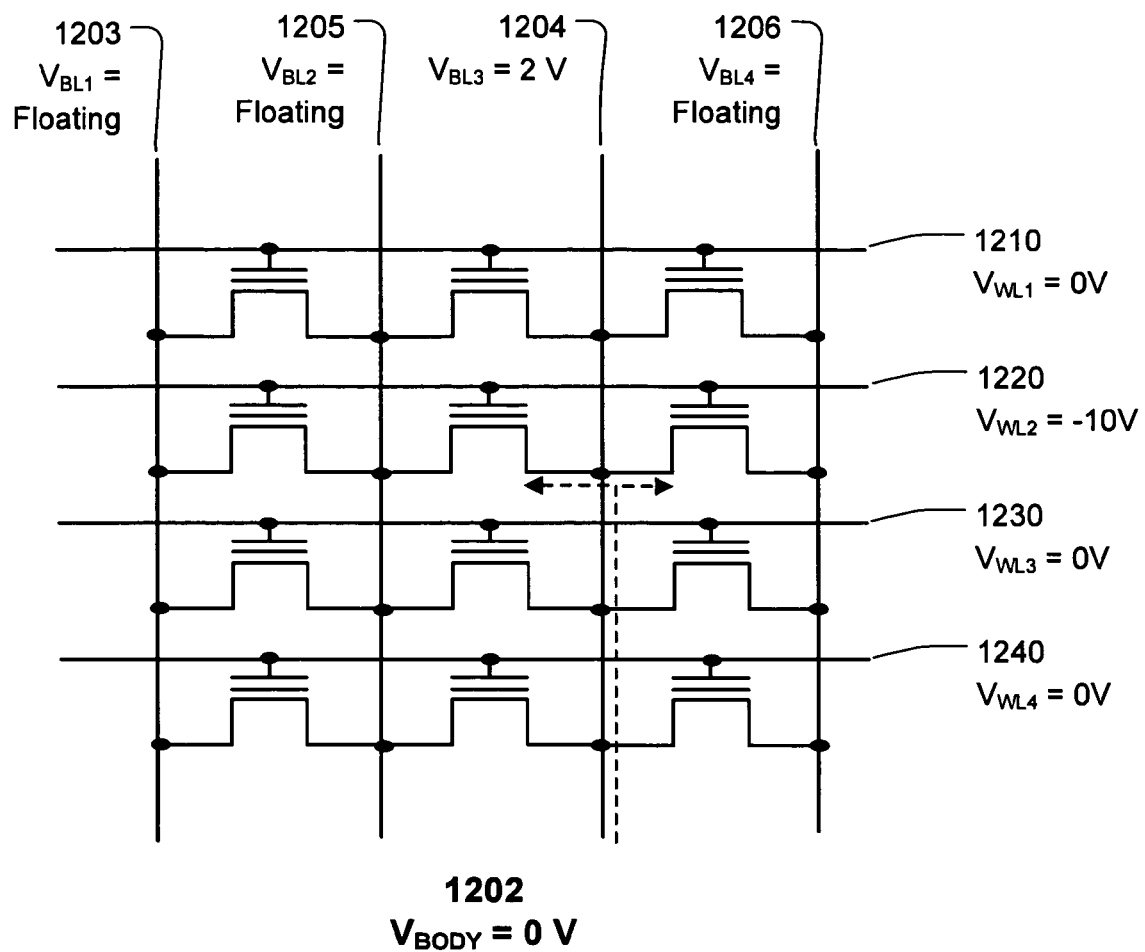
FIG. 15 is a diagram of a read operation being performed on a virtual ground array arrangement of nonvolatile memory cells.

FIG. 15 is a diagram of a read operation being performed on a virtual ground array arrangement of nonvolatile memory cells. In the bias arrangement of FIG. 15, the voltage of the word lines 1210, 1230, and 1240 is 0 V; the voltage of the word line 1220 is −10 V; the voltage of the bit line 1204 is 2 V; the voltage of the bit lines 1203, 1205, and 1206 is floating; and the voltage of the substrate 1202 is 0 V. A current is symbolically shown flowing from the bit line 1204, through the memory cells controlled by word line 1220 and bit line 1204, and into the substrate 1202. The read operation being performed in FIGS. 1A and 1B is similar to the read operation of FIG. 15. In some embodiments, a subset of all the bit lines are read.

Figure 16:
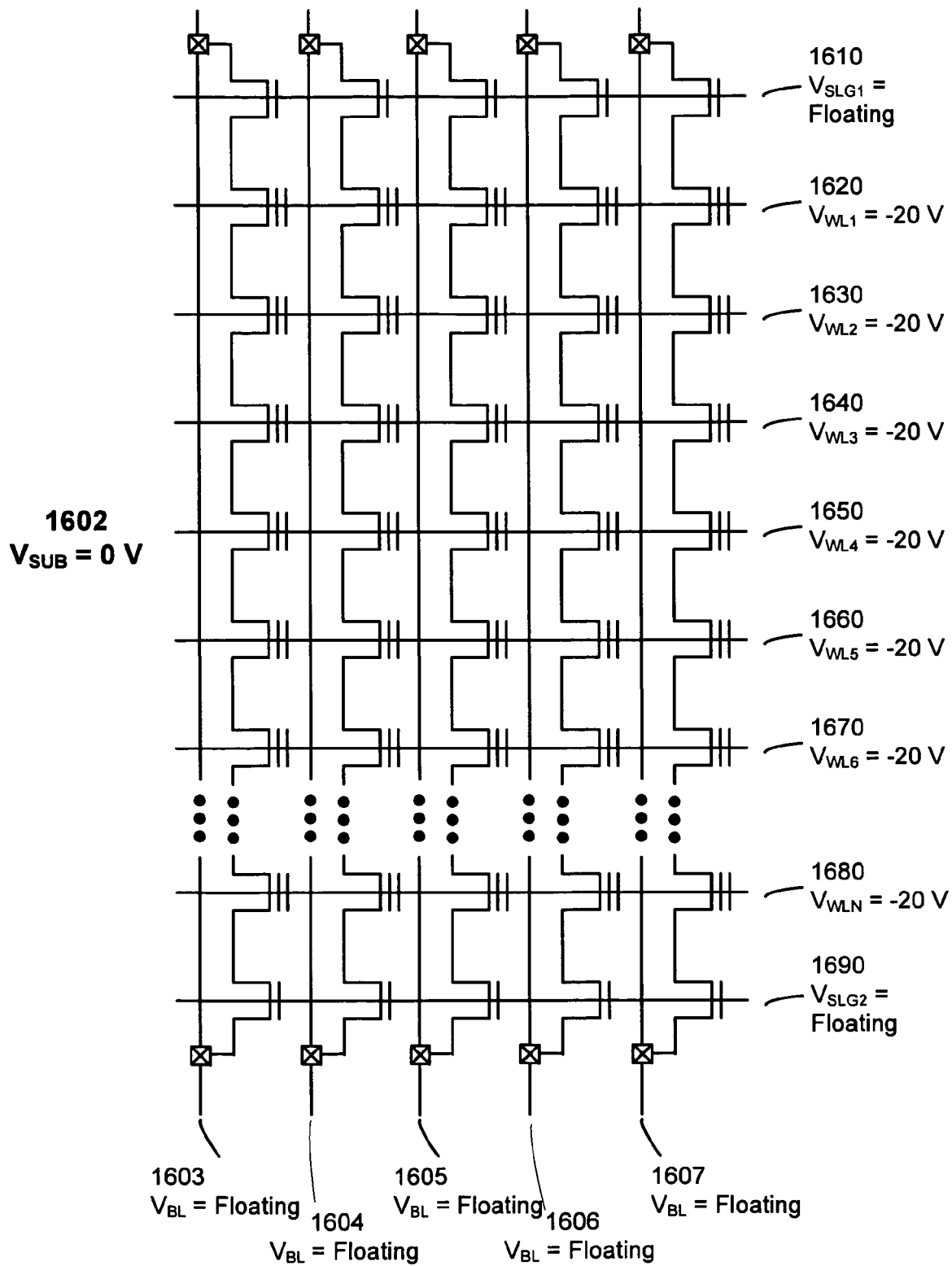
FIG. 16 is a diagram of an erase operation via one bias arrangement being performed on an array of nonvolatile memory cells interconnected as columns of cells arranged in series.
Figure 17:
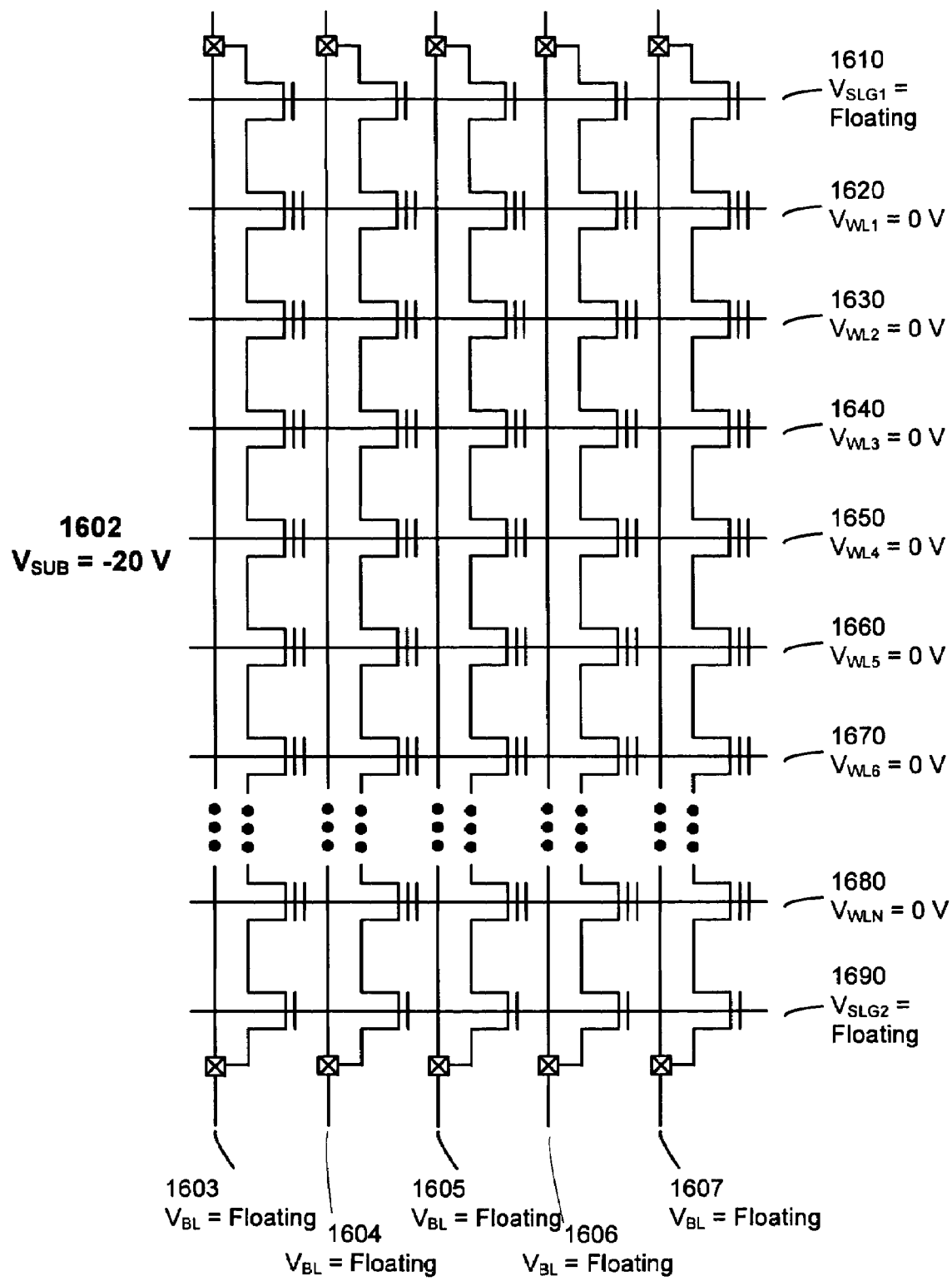
FIG. 17 is a diagram of an erase operation via another bias arrangement being performed on an array of nonvolatile memory cells interconnected as columns of cells arranged in series.

FIGS. 16 and 17 are diagrams of an erase operation performed on an array of nonvolatile memory cells interconnected as columns of cells arranged in series. In the bias arrangement of FIG. 16, the voltage of the word lines 1620, 1630, 1640, 1650, 1660, 1670, and 1680 is −20 V; the voltage of the word lines 1610 and 1690 is floating; the voltage of the bit lines 1603, 1604, 1605, 1606, and 1607 is floating; and the voltage of the substrate 1602 is 0 V. The memory array of FIG. 17 is similar to the memory array of FIG. 16, except for the direction of movement of the electrons. In the bias arrangement of FIG. 17, the voltage of the word lines 1620, 1630, 1640, 1650, 1660, 1670, and 1680 is 0 V; the voltage of the word lines 1610 and 1690 is floating; the voltage of the bit lines 1603, 1604, 1605, 1606, and 1607 is floating; and the voltage of the substrate 1602 is −20 V. The erase operation of FIG. 7A is similar to the erase operation on the virtual ground array of FIG. 16. The erase operation of FIG. 7B is similar to the erase operation on the virtual ground array of FIG. 17.

Figure 18:
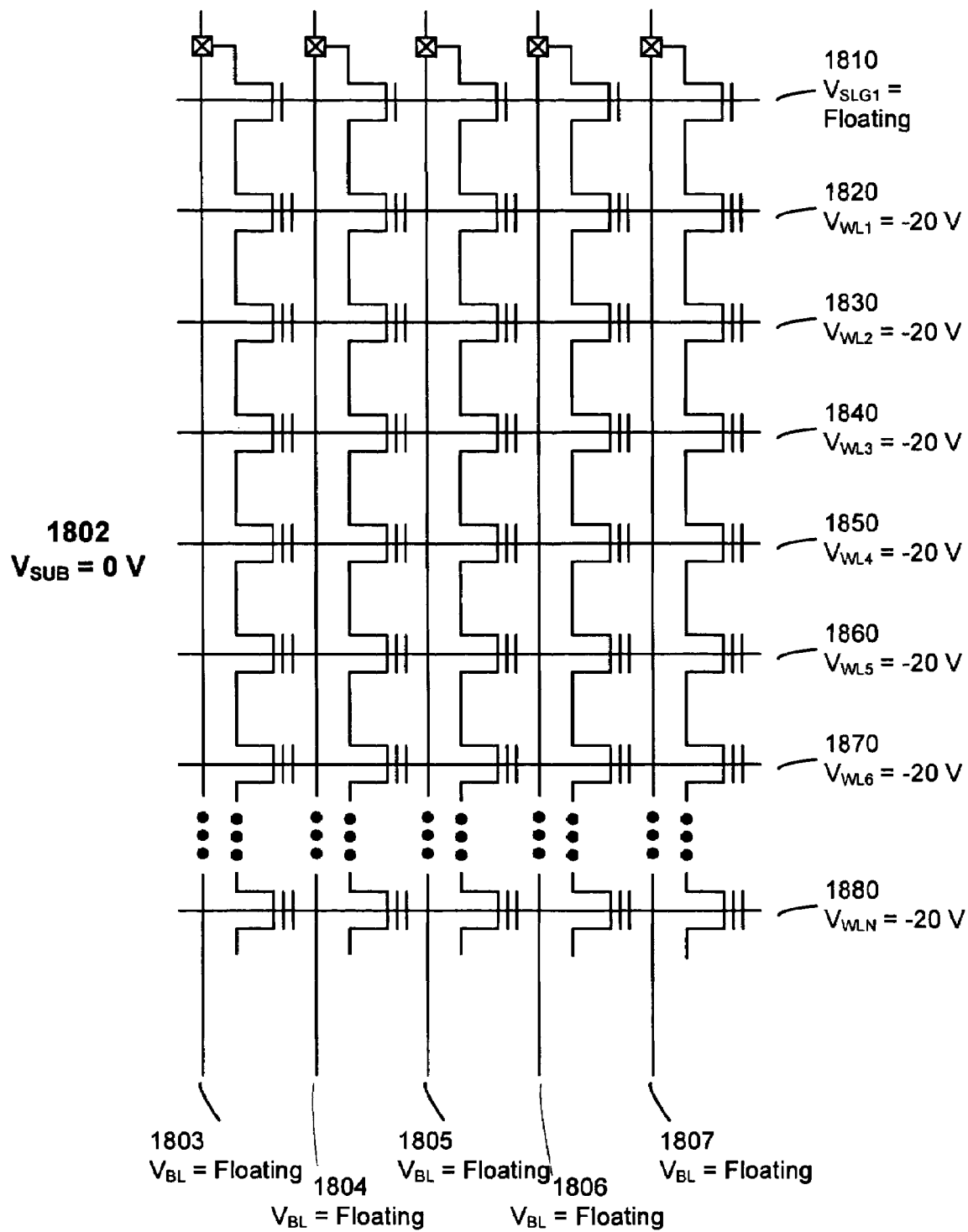
FIG. 18 is a diagram of an erase operation via one bias arrangement being performed on an array of nonvolatile memory cells interconnected as columns of cells arranged in series with a floating end.
Figure 19:
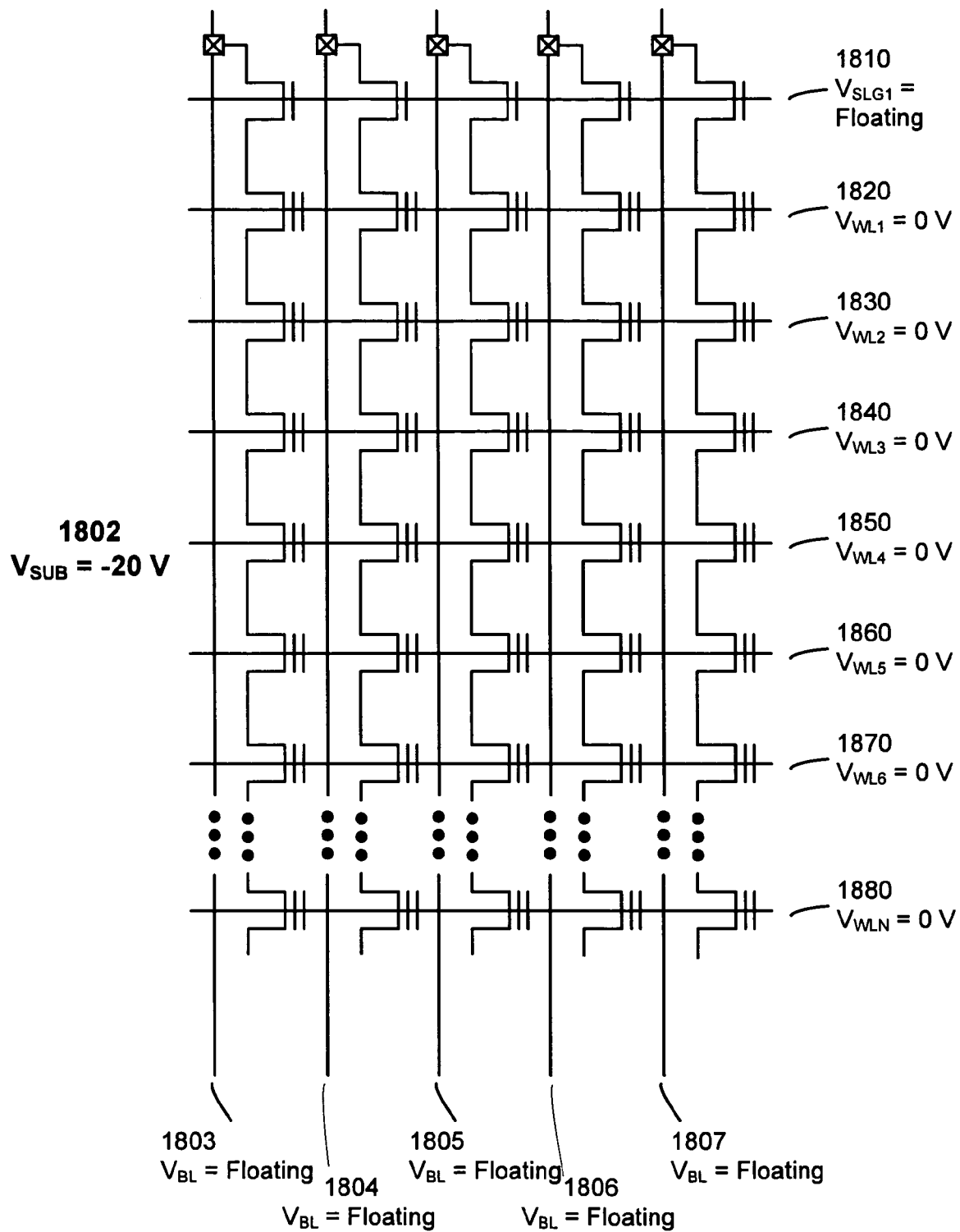
FIG. 19 is a diagram of an erase operation via another bias arrangement being performed on an array of nonvolatile memory cells interconnected as columns of cells arranged in series with a floating end.

FIGS. 18 and 19 are diagrams of an erase operation being performed on an array of nonvolatile memory cells interconnected as columns of cells arranged in series with a floating end. In the bias arrangement of FIG. 18, the voltage of the word lines 1820, 1830, 1840, 1850, 1860, 1870, and 1880 is −20 V; the voltage of the word line 1810 is floating; the voltage of the bit lines 1803, 1804, 1805, 1806, and 1807 is floating; and the voltage of the substrate 1802 is 0 V. The memory array of FIG. 18 is similar to the memory array of FIG. 19, except for the direction of movement of the electrons. In the bias arrangement of FIG. 19, the voltage of the word lines 1820, 1830, 1840, 1850, 1860, 1870, and 1880 is 0 V; the voltage of the word line 1810 is floating; the voltage of the bit lines 1803, 1804, 1805, 1806, and 1807 is floating; and the voltage of the substrate 1802 is −20 V. The erase operation of FIG. 7A is similar to the erase operation on the memory array of FIG. 18. The erase operation of FIG. 7B is similar to the erase operation on the memory array of FIG. 19.

Figure 20:
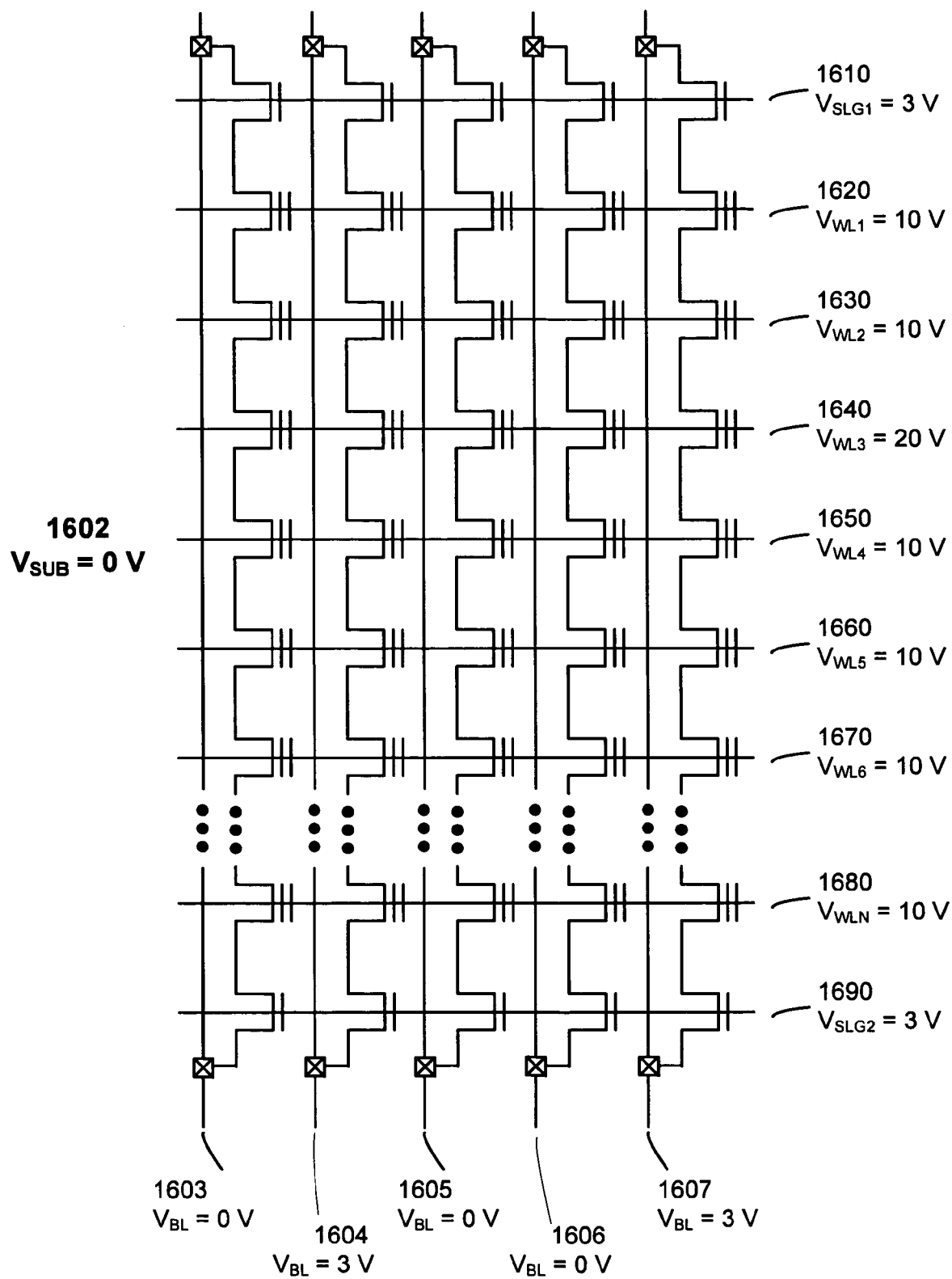
FIG. 20 is a diagram of a program operation being performed on an array of nonvolatile memory cells interconnected as columns of cells arranged in series.

FIG. 20 is a diagram of a program operation being performed on an array of nonvolatile memory cells interconnected as columns of cells arranged in series. In the bias arrangement of FIG. 20, the voltage of the word lines 1620, 1630, 1640, 1650, 1660, 1670, and 1680 are 10 V; the voltage of the word lines 1610 and 1690 is 3 V; the voltage of the bit lines 1603, 1605, and 1606 is 0 V; the voltage of the bit lines 1604 and 1607 is 3 V; and the voltage of the substrate 1602 is 0 V. Electrons are programmed from the bit lines 1603, 1605, and 1606 into the memory cells controlled by both the word line 1640 and the bit lines 1603, 1605, and 1606.

Figure 21:
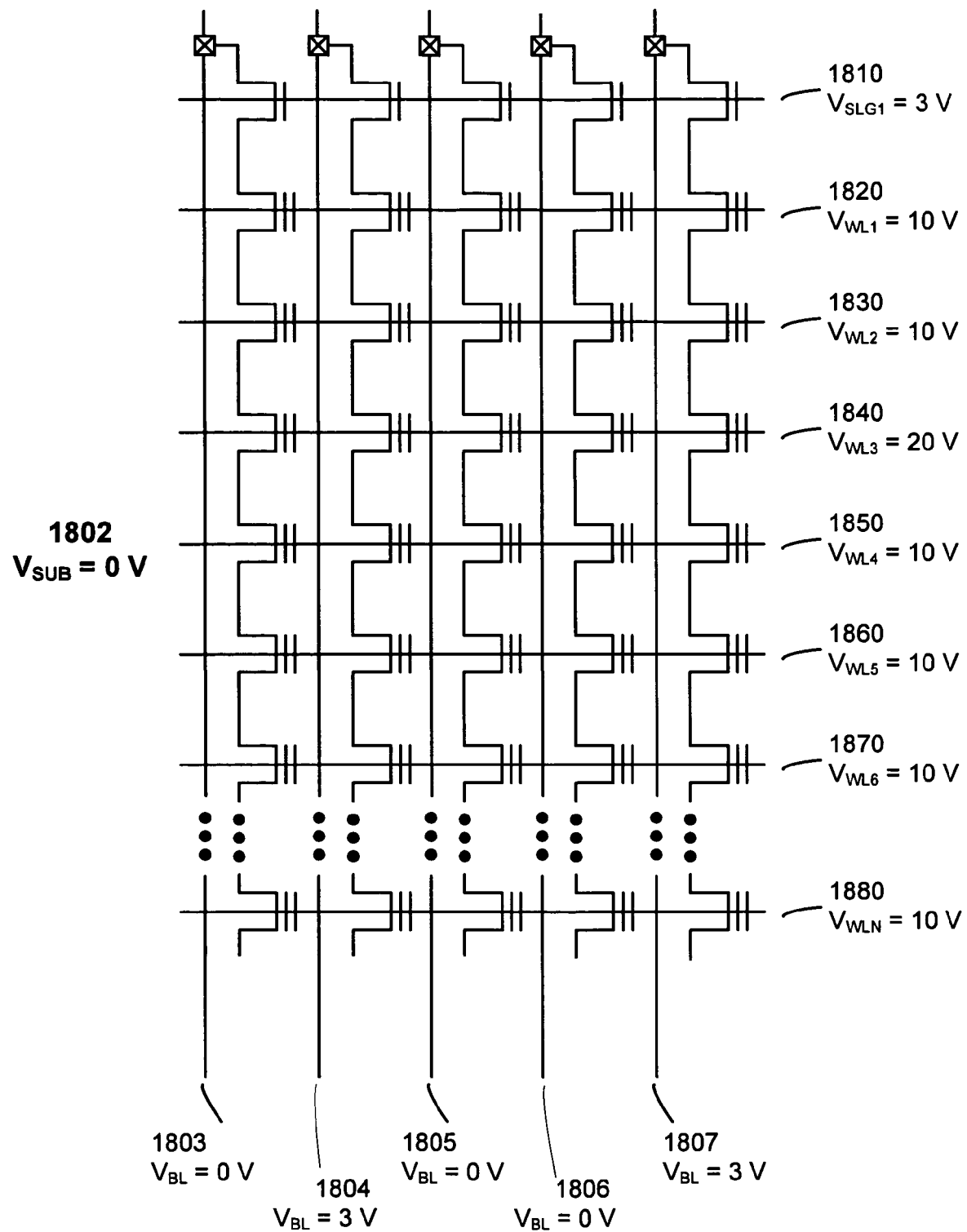
FIG. 21 is a diagram of a program operation being performed on an array of nonvolatile memory cells interconnected as columns of cells arranged in series with a floating end.

FIG. 21 is a diagram of a program operation being performed on an array of nonvolatile memory cells interconnected as columns of cells arranged in series with a floating end. In the bias arrangement of FIG. 20, the voltage of the word lines 1820, 1830, 1840, 1850, 1860, 1870, and 1880 are 10 V; the voltage of the word line 1810 is 3 V; the voltage of the bit lines 1803, 1805, and 1806 is 0 V; the voltage of the bit lines 1804 and 1807 is 3 V; and the voltage of the substrate 1802 is 0 V. Electrons are programmed from the bit lines 1803, 1805, and 1806 into the memory cells controlled by both the word line 1840 and the bit lines 1803, 1805, and 1806.

Figure 22:
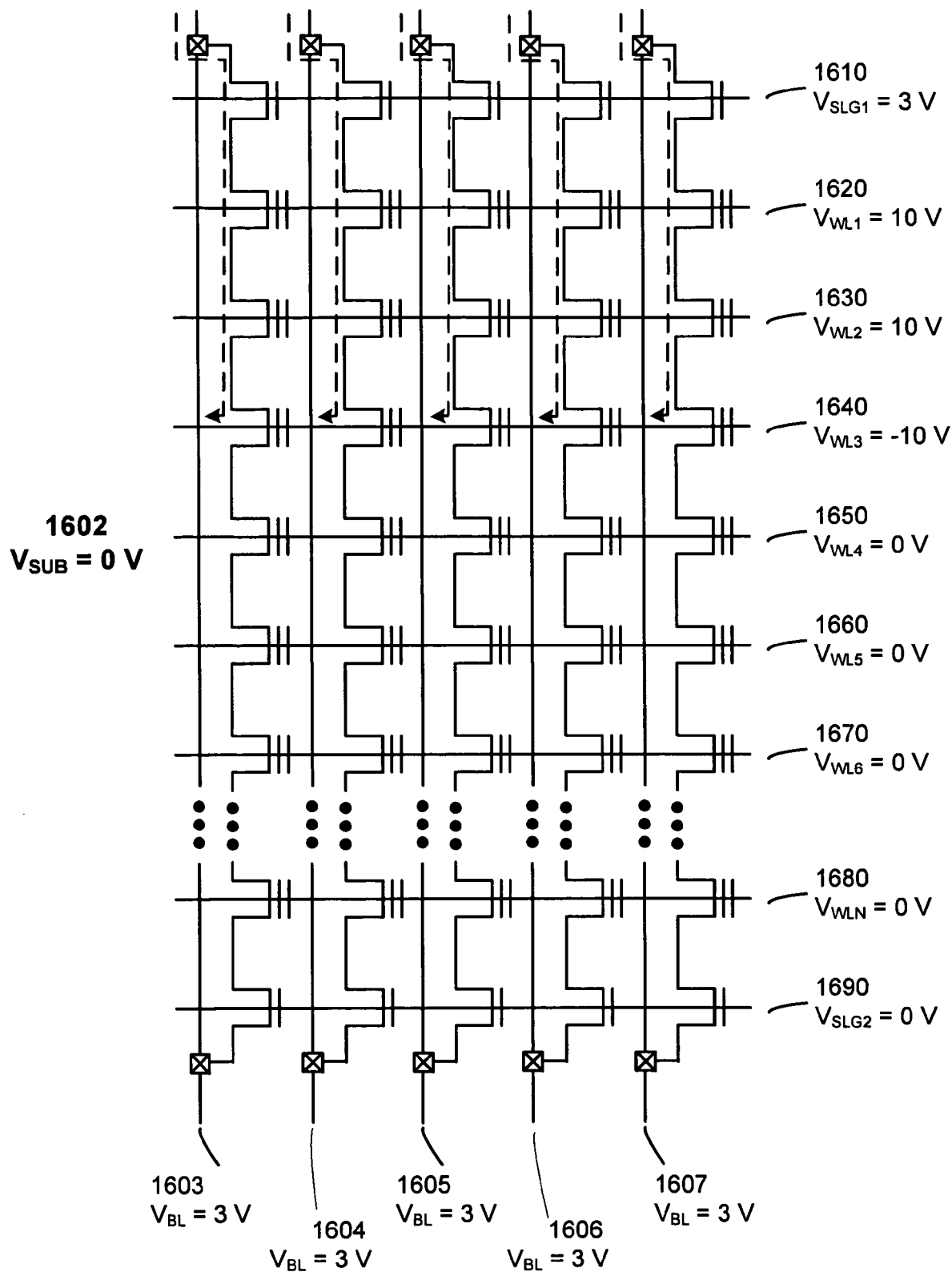
FIG. 22 is a diagram of a read operation being performed on an array of nonvolatile memory cells interconnected as columns of cells arranged in series, via one end of the series.
Figure 23:
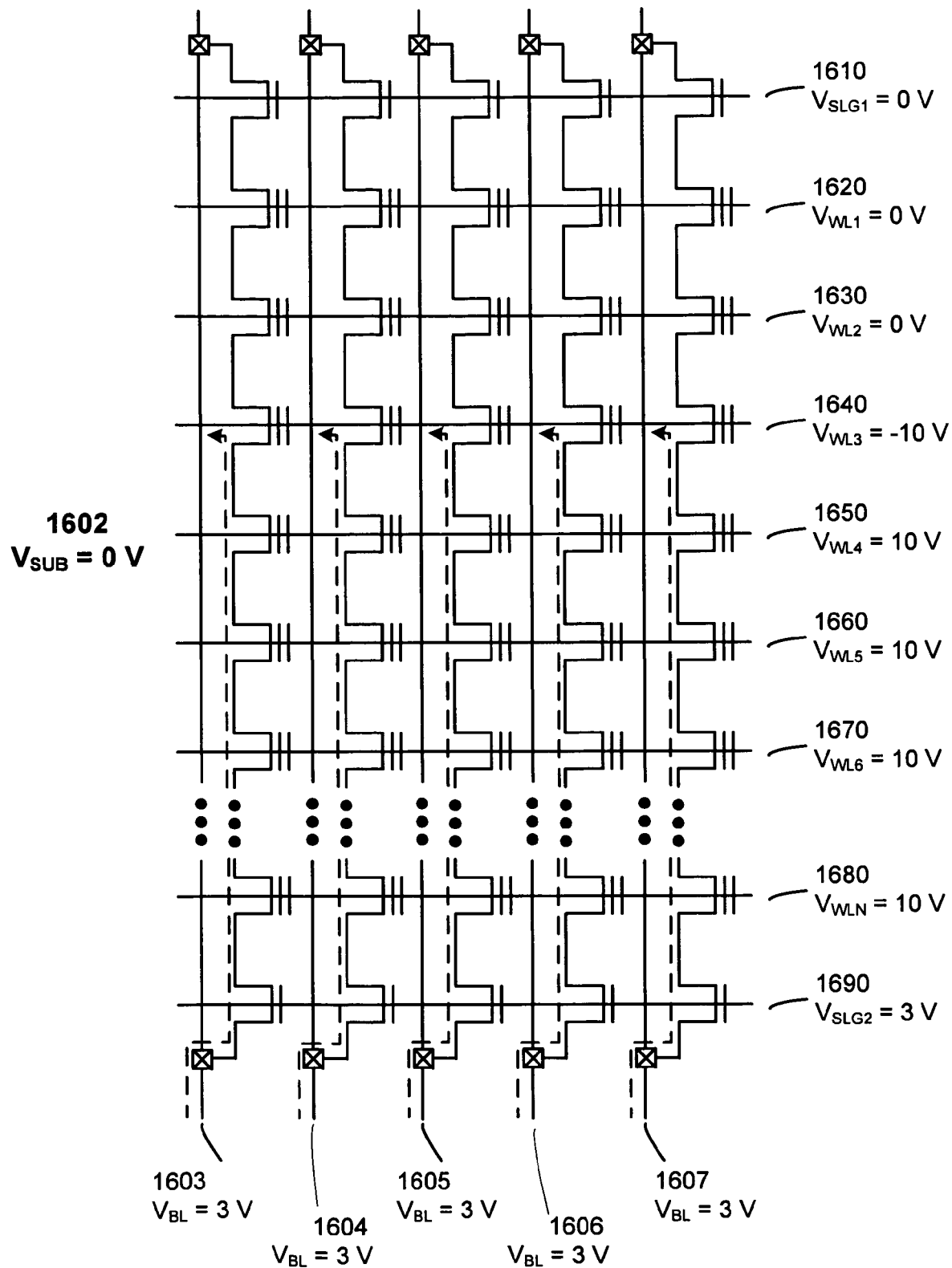
FIG. 23 is a diagram of a read operation being performed on an array of nonvolatile memory cells interconnected as columns of cells arranged in series, via another end of the series.
Figure 24:
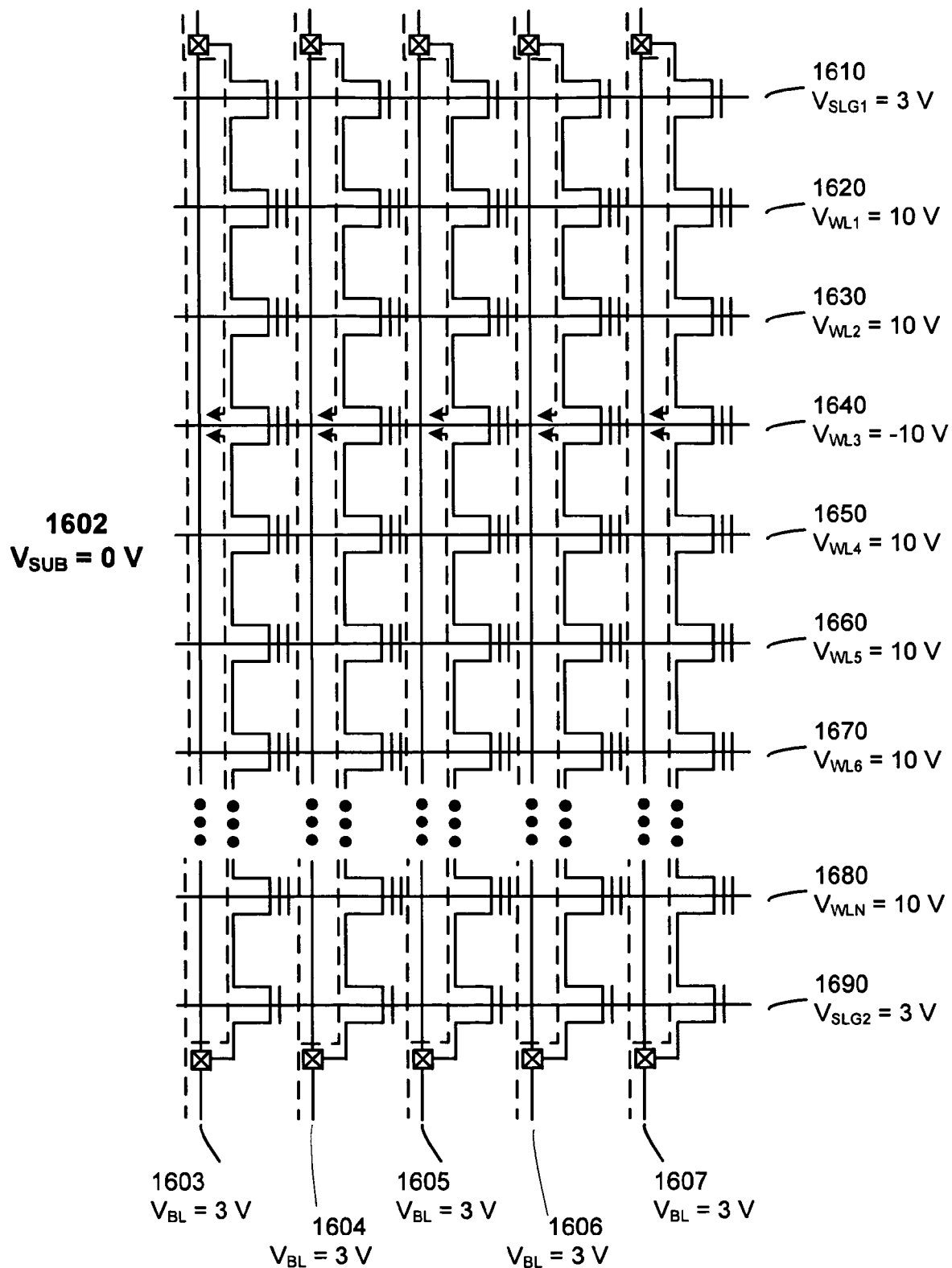
FIG. 24 is a diagram of a read operation being performed on an array of nonvolatile memory cells interconnected as columns of cells arranged in series, via both ends of the series.

FIGS. 22, 23, and 24 are diagrams of a read operation being performed on an array of nonvolatile memory cells interconnected as columns of cells arranged in series. In the bias arrangement of FIG. 22, the voltage of the word line 1610 is 3 V; the voltage of the word lines 1620 and 1630 is 10 V; the voltage of the word line 1640 is −10 V; the voltage of the word lines 1650, 1660, 1670, 1680, and 1690 is 0 V; the voltage of the bit lines 1603, 1604, 1605, 1606, and 1607 is 3 V; and the voltage of the substrate 1602 is 0 V. Currents are symbolically shown flowing from the bit lines 1603, 1604, 1605, 1606, and 1607 via the pass transistor row controlled by word line 1610; through the memory cells controlled by word line 1640; and into the substrate 1602. In the bias arrangement of FIG. 23, the voltage of the word lines 1610, 1620, and 1630 is 0 V; the voltage of the word line 1640 is −10 V; the voltage of the word lines 1650, 1660, 1670, and 1680 is 10 V; the voltage of the word line 1690 is 3 V; the voltage of the bit lines 1603, 1604, 1605, 1606, and 1607 is 3 V; and the voltage of the substrate 1602 is 0 V. Currents are symbolically shown flowing from the bit lines 1603, 1604, 1605, 1606, and 1607 via the pass transistor row controlled by word line 1690; through the memory cells controlled by word line 1640; and into the substrate 1602. In the bias arrangement of FIG. 24, the voltage of the word lines 1610 and 1690 is 3 V; the voltage of the word lines 1620, 1630, 1650, 1660, 1670, and 1680 is 10 V; the voltage of the word line 1640 is −10 V; the voltage of the bit lines 1603, 1604, 1605, 1606, and 1607 is 3 V; and the voltage of the substrate 1602 is 0 V. Currents are symbolically shown flowing from the bit lines 1603, 1604, 1605, 1606, and 1607 via the pass transistor rows controlled by word lines 1610 and 1690; through the memory cells controlled by word line 1640; and into the substrate 1602. The read operation being performed in FIGS. 1A and 1B is similar to the read operations of FIGS. 22, 23, and 24. The read current in FIG. 24 flows through both current terminals of the memory cells controlled by word line 1640 into the substrate 1602, whereas the read current in FIGS. 22 and 23 flows through one current terminal of the memory cells controlled by word line 1640 into the substrate 1602. Thus the read current in FIG. 24 is larger than the read current in FIGS. 22 and 23. In some embodiments, a subset of all the bit lines are read.

Figure 25:
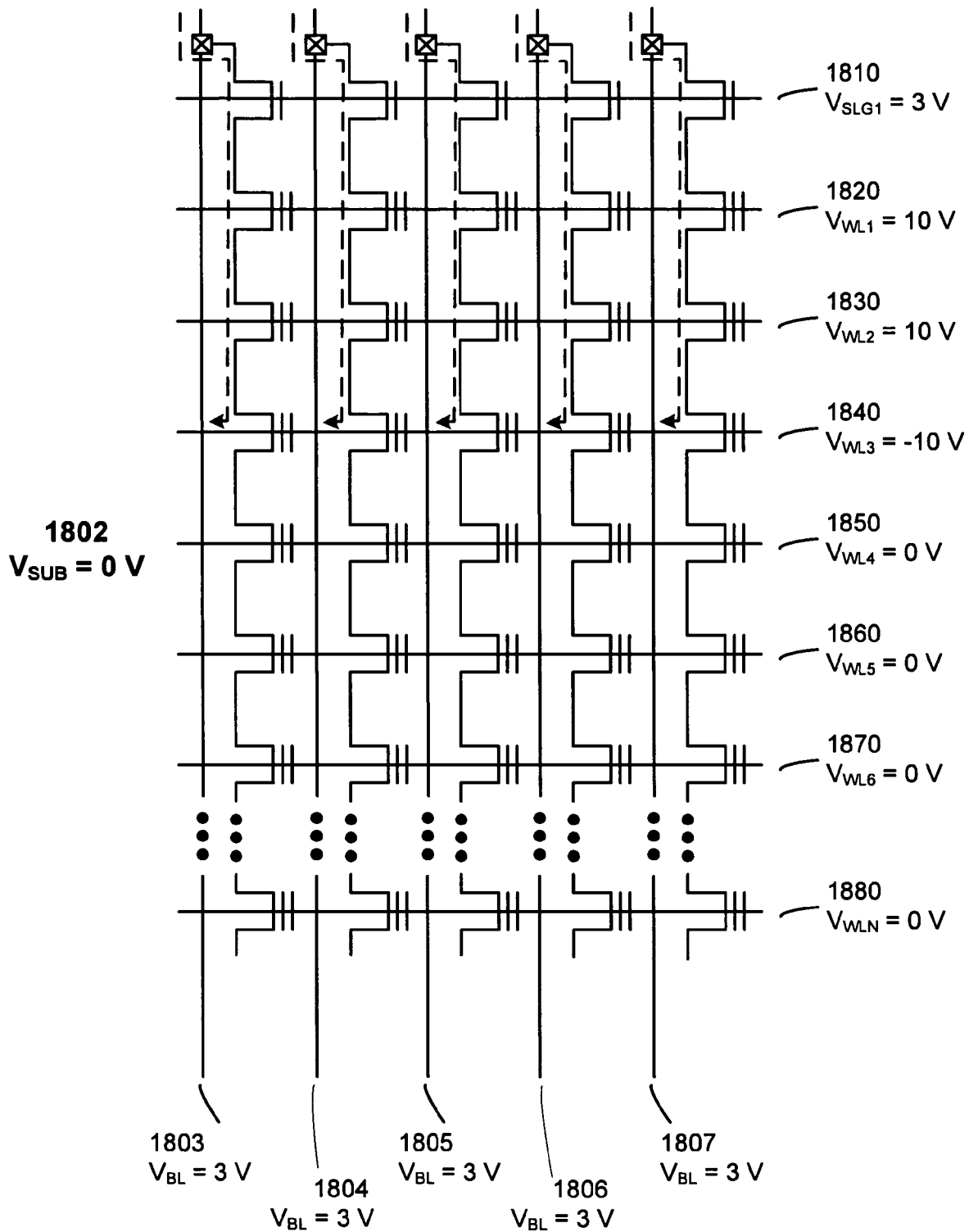
FIG. 25 is a diagram of a read operation being performed on an array of nonvolatile memory cells interconnected as columns of cells arranged in series with a floating end.

FIG. 25 is a diagram of a read operation being performed on an array of nonvolatile memory cells interconnected as columns of cells arranged in series with a floating end. In the bias arrangement of FIG. 25, the voltage of the word line 1810 is 3 V; the voltage of the word lines 1820 and 1830 is 10 V; the voltage of the word line 1840 is −10 V; the voltage of the word lines 1850, 1860, 1870, and 1880 is 0 V; the voltage of the bit lines 1803, 1804, 1805, 1806, and 1807 is 3 V; and the voltage of the substrate 1802 is 0 V. Currents are symbolically shown flowing from the bit lines 1803, 1804, 1805, 1806, and 1807 via the pass transistor row controlled by word line 1810; through the memory cells controlled by word line 1840; and into the substrate 1802. In some embodiments, a subset of all the bit lines are read.

Figure 26:
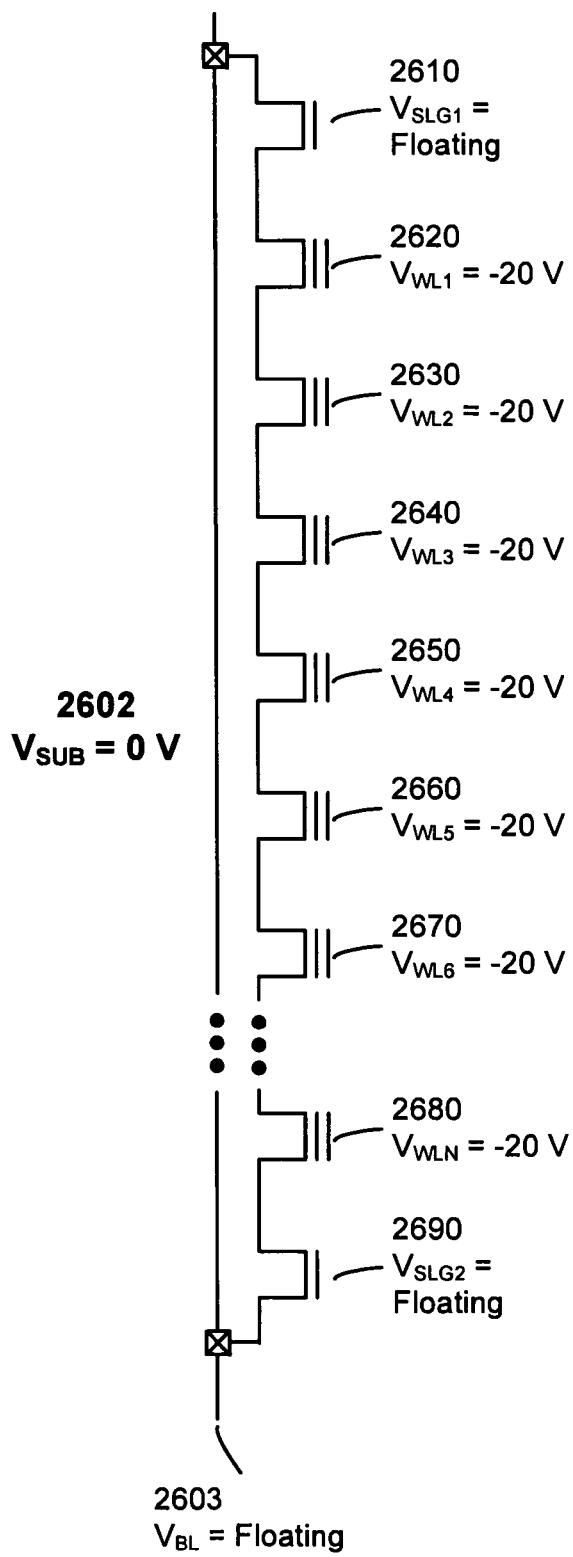
FIG. 26 is a diagram of an erase operation via one bias arrangement being performed on nonvolatile memory cells interconnected as a column of cells arranged in series.
Figure 27:
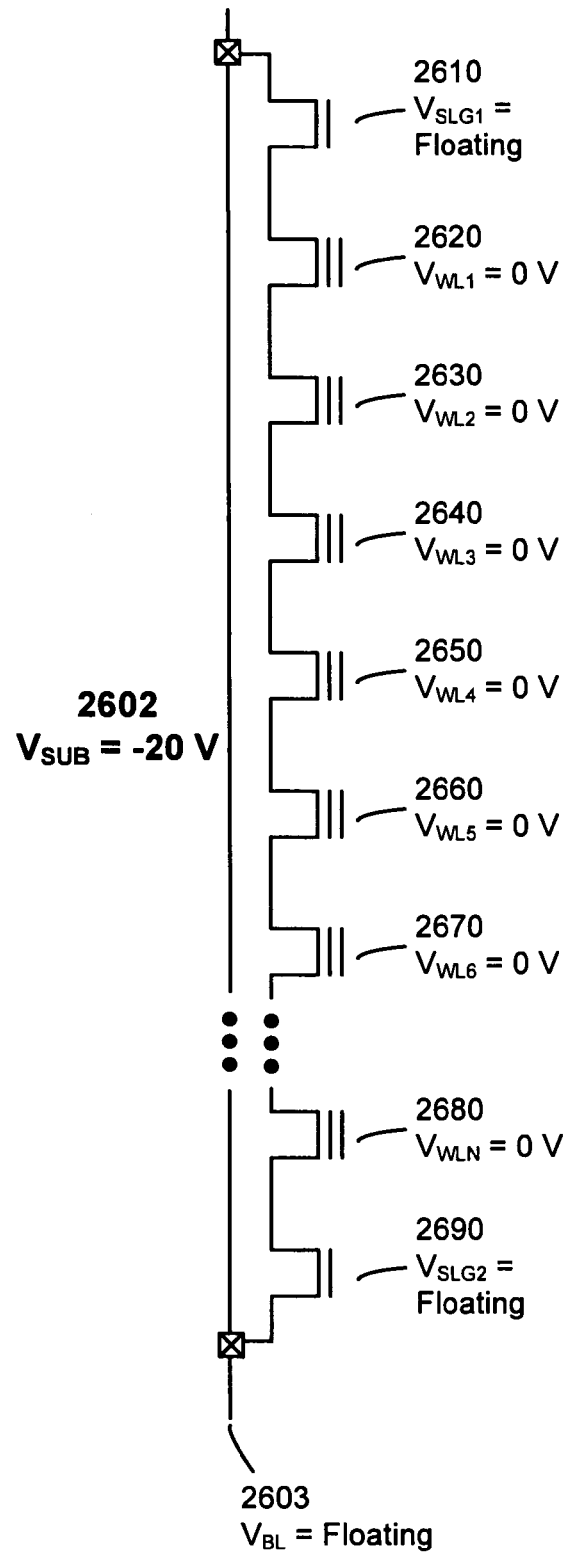
FIG. 27 is a diagram of an erase operation via another bias arrangement being performed on nonvolatile memory cells interconnected as a column of cells arranged in series.

FIGS. 26 and 27 are diagrams of an erase operation being performed on nonvolatile memory cells interconnected as a column of cells arranged in series. In the bias arrangement of FIG. 26, the voltage of the gate of memory cells 2620, 2630, 2640, 2650, 2660, 2670, and 2680 is −20 V; the voltage of the gate of memory cells 2610 and 2690 is floating; the voltage of the bit line 2603 is floating; and the voltage of the substrate 2602 is 0 V. The memory column of FIG. 27 is similar to the memory array of FIG. 26, except for the direction of movement of the electrons. In the bias arrangement of FIG. 27, the voltage of the gate of memory cells 2620, 2630, 2640, 2650, 2660, 2670, and 2680 is 0 V; the voltage of the gate of memory cells 2610 and 2690 is floating; the voltage of the bit line 2603 is floating; and the voltage of the substrate 2602 is −20 V. The erase operation of FIG. 7A is similar to the erase operation on the memory column of FIG. 26. The erase operation of FIG. 7B is similar to the erase operation on the memory column of FIG. 17.

FIGS. 28 and 29 are diagrams of an erase operation being performed on nonvolatile memory cells interconnected as a column of cells arranged in series with a floating end. In the bias arrangement of FIG. 28, the voltage of the gate of memory cell 2810 is floating; the voltage of the gates of memory cells 2820, 2830, 2840, 2850, 2860, 2870, and 2880 is −20 V; the voltage of the bit line 2803 is floating; and the voltage of the substrate 2802 is 0 V. The memory column of FIG. 29 is similar to the memory column of FIG. 29, except for the direction of movement of the electrons. In the bias arrangement of FIG. 29, the voltage of the gate of memory cell 2810 is floating; the voltage of the gates of memory cells 2820, 2830, 2840, 2850, 2860, 2870, and 2880 is 0 V; the voltage of the bit line 2803 is floating; and the voltage of the substrate 2802 is −20 V. The erase operation of FIG. 7A is similar to the erase operation on the memory column of FIG. 28. The erase operation of FIG. 7B is similar to the erase operation on the memory column of FIG. 29.

FIG. 30 is a diagram of a program operation being performed on nonvolatile memory cells interconnected as a column of cells arranged in series. In the bias arrangement of FIG. 30, the voltage of the gates of memory cells 2610 and 2690 is 3 V; the voltage of the gates of memory cells 2620, 2630, 2650, 2660, 2670, and 2680 are 10 V; the voltage of the gate of memory cell 2640 is 20 V; the voltage of the bit line 2603 is 0 V; and the voltage of the substrate 2602 is 0 V. Electrons are programmed from the bit line 2603 into the memory cell controlled by the word line 2640.

FIG. 31 is a diagram of a program operation being performed on nonvolatile memory cells interconnected as a column of cells arranged in series with a floating end. In the bias arrangement of FIG. 31, the voltage of the gate of memory cell 2810 is 3 V; the voltage of the gates of memory cells 2820, 2830, 2850, 2860, 2870, and 2880 are 10 V; the voltage of the gate of memory cell 2840 is 20 V; the voltage of the bit line 2803 is 0 V; and the voltage of the substrate 2802 is 0 V. Electrons are programmed from the bit line 2803 into the memory cell controlled by the word line 2840.

Figure 32:
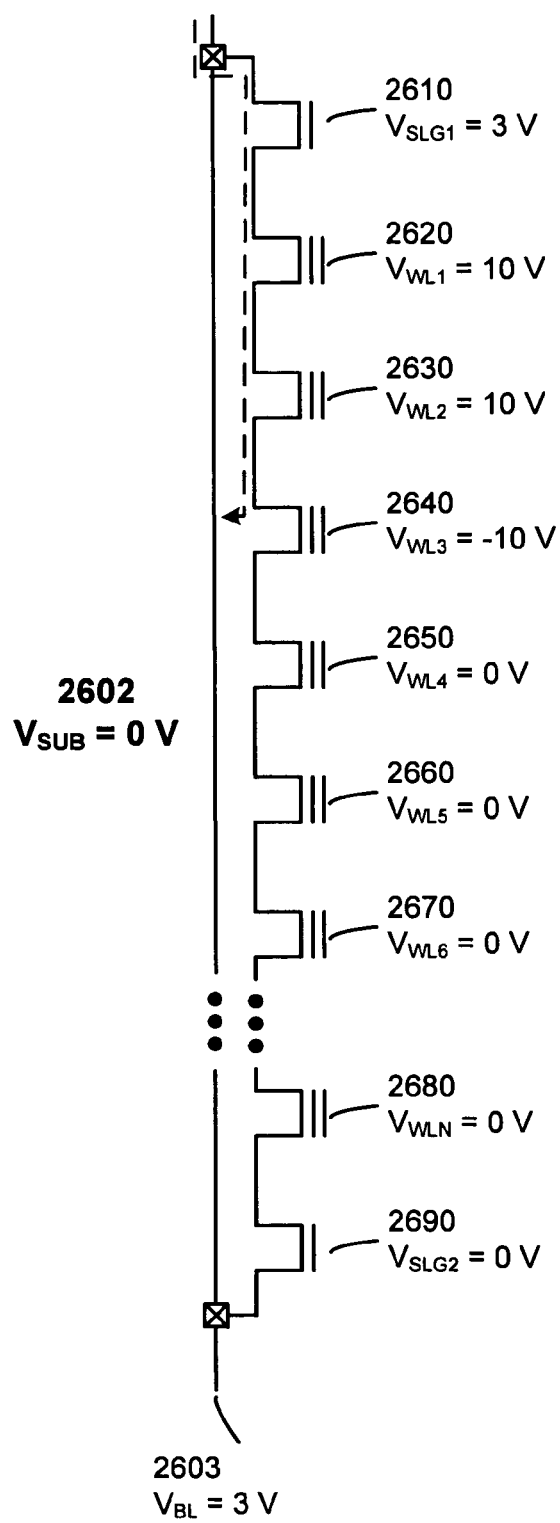
FIG. 32 is a diagram of a read operation being performed on nonvolatile memory cells interconnected as a column of cells arranged in series, via one end of the series.
Figure 33:
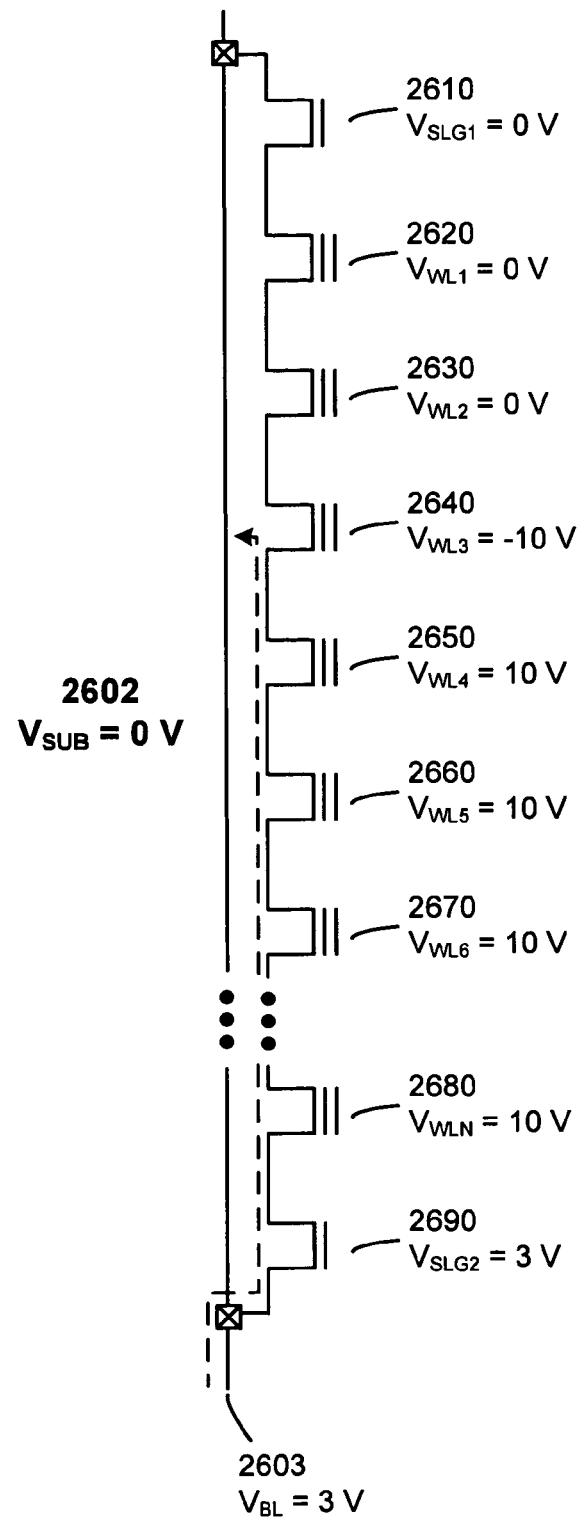
FIG. 33 is a diagram of a read operation being performed on nonvolatile memory cells interconnected as a column of cells arranged in series, via another end of the series.

FIGS. 32, 33, and 34 are diagrams of a read operation being performed on memory cells interconnected as a column of cells arranged in series. In the bias arrangement of FIG. 32, the voltage of the gate of memory cell 2610 is 3 V; the voltage of the gates of memory cells 2620 and 2630 is 10 V; the voltage of the gate of memory cell 2640 is −10 V; the voltage of the gates of memory cells 2650, 2660, 2670, 2680, and 2690 is 0 V; the voltage of the bit line 2603 is 3 V; and the voltage of the substrate 2602 is 0 V. Current is symbolically shown flowing from the bit line 2603 via the pass transistor 2610; through the memory cell 2640; and into the substrate 2602. In the bias arrangement of FIG. 33, the voltage of the gates of memory cells 2610, 2620, and 2630 is 0 V; the voltage of the gate of memory cell 2640 is −10 V; the voltage of the gates of memory cells 2650, 2660, 2670, and 2680 is 10 V; the voltage of the word line 2690 is 3 V; the voltage of the bit line 2603 is 3 V; and the voltage of the substrate 2602 is 0 V. Current is symbolically shown flowing from the bit line 2603 via the pass transistor 2690; through the memory cell 2640; and into the substrate 2602. In the bias arrangement of FIG. 34, the voltage of the gates of memory cells 2610 and 2690 is 3 V; the voltage of the gates of memory cells 2620, 2630, 2650, 2660, 2670, and 2680 is 10 V; the voltage of the gate of memory cell 2640 is −10 V; the voltage of the bit line 2603 is 3 V; and the voltage of the substrate 2602 is 0 V. Current is symbolically shown flowing from the bit line 2603 via the pass transistors 2610 and 2690; through the memory cell 2640; and into the substrate 2602. The read operation being performed in FIGS. 1A and 1B is similar to the read operations of FIGS. 32, 33, and 34. The read current in FIG. 34 flows through both current terminals of the memory cell 2640 into the substrate 2602, whereas the read current in FIGS. 32 and 33 flows through one current terminal of the memory cell 2640 into the substrate 2602. Thus the read current in FIG. 34 is larger than the read current in FIGS. 32 and 33.

FIG. 35 is a diagram of a read operation being performed on nonvolatile memory cells interconnected as a column of cells arranged in series with a floating end. In the bias arrangement of FIG. 35, the voltage of the gate of memory cell 2810 is 3 V; the voltage of the gates of memory cells 2820 and 2830 is 10 V; the voltage of the gate of memory cell 2840 is −10 V; the voltage of the gates of memory cells 2850, 2860, 2870, and 2880 is 0 V; the voltage of the bit line 2803 is 3 V; and the voltage of the substrate 2802 is 0 V. Current is symbolically shown flowing from the bit line 2803 via the pass transistor 2810; through the memory cell 2840; and into the substrate 2802.

Figure 36A:
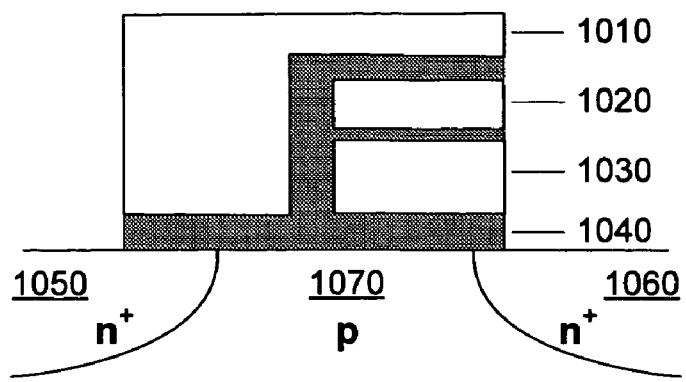
FIGS. 36A-36C are simplified diagrams of other nonvolatile memory cells with various charge storage structures.
Figure 36B:
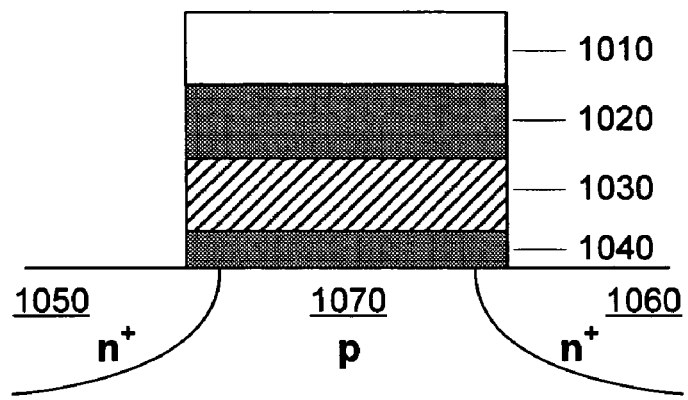
Figure 36C:
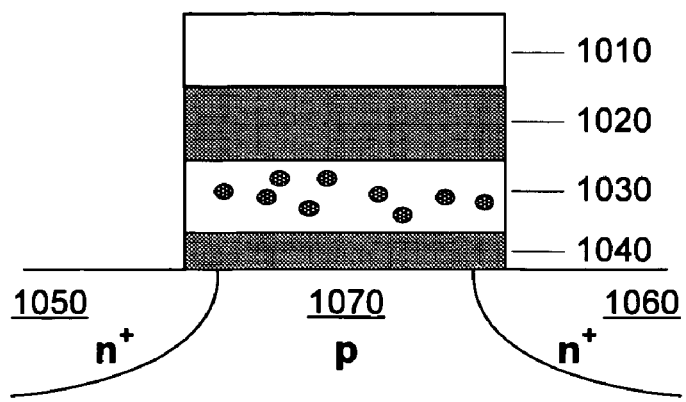

FIGS. 36A-36C show simplified diagrams of other nonvolatile memory cells with various charge storage structures. FIG. 36A shows the structure of a split gate memory cell, with a first gate 1020, a second gate 1010, a charge storage structure 1030, and oxide 1040. FIG. 36B shows a nonvolatile memory cell resembling the nonvolatile memory cell of FIG. 1, but with a floating gate 1030, often made of polysilicon. FIG. 36C shows a nonvolatile memory cell resembling the nonvolatile memory cell of FIG. 1, but with a nanoparticle charge storage structure 1030.

Figure 37:
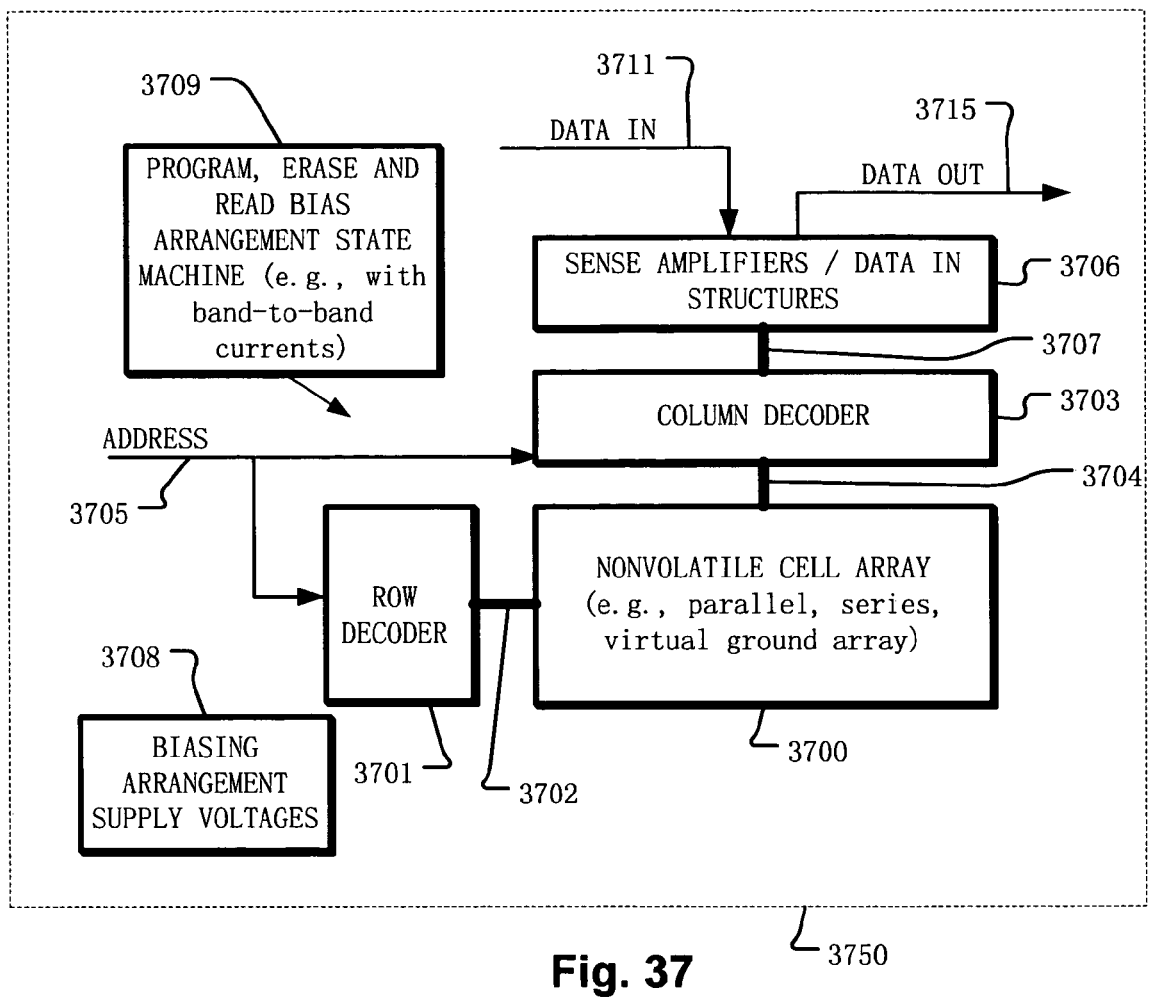
FIG. 37 is a simplified diagram of an integrated circuit with an array of charge trapping memory cells and control circuitry.

FIG. 37 is a simplified diagram of an integrated circuit with an array of charge trapping memory cells and control circuitry. The integrated circuit 3750 includes a memory array 3700 implemented using nonvolatile memory cells, on a semiconductor substrate. The memory cells of array 3700 may be interconnected in parallel, in series, or in a virtual ground array. A row decoder 3701 is coupled to a plurality of word lines 3702 arranged along rows in the memory array 3700. A column decoder 3703 is coupled to a plurality of bit lines 3704 arranged along columns in the memory array 3700. Addresses are supplied on bus 3705 to column decoder 3703 and row decoder 3701. Sense amplifiers and data-in structures in block 3706 are coupled to the column decoder 3703 via data bus 3707. Data is supplied via the data-in line 3711 from input/output ports on the integrated circuit 3750, or from other data sources internal or external to the integrated circuit 3750, to the data-in structures in block 3706. Data is supplied via the data-out line 3715 from the sense amplifiers in block 3706 to input/output ports on the integrated circuit 3750, or to other data destinations internal or external to the integrated circuit 3750. A bias arrangement state machine 3709 controls the application of bias arrangement supply voltages 3708, such as for the erase verify and program verify voltages, and the arrangements for programming, erasing, and reading the memory cells, such as with the band-to-band currents.

In other embodiments, the select transistors are omitted.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a nonvolatile memory array storing data as charge storage states, the nonvolatile memory including nonvolatile memory cells arranged in columns, each of the nonvolatile memory cells including a first and a second current carrying node in a substrate region, and including a charge storage structure, and one or more dielectric structures at least partly between the charge storage structure and a source of gate voltage and at least partly between the substrate region and the charge storage structure, the method comprising:

performing one or more memory operations comprising:
applying a bit line bias to a bit line electrically connected to a first end of a column of nonvolatile memory cells, the column arranged in series such that adjacent first and second current carrying nodes of adjacent memory cells in the column are electrically connected;
floating a second end of the column of nonvolatile memory cells; and
applying the gate voltage to word lines electrically connected to the nonvolatile memory cells of the column.

2. The method of claim 1, wherein said one or more memory operations includes a program operation, and during the program operation, said applying the bit line bias to the bit line electrically connected to the first end of the column of nonvolatile memory cells occurs at a same time as said floating the second end of the column of nonvolatile memory cells.

3. The method of claim 1, wherein said one or more memory operations includes a read operation, and during the read operation, said applying the bit line bias to the bit line electrically connected to the first end of the column of nonvolatile memory cells occurs at a same time as said floating the second end of the column of nonvolatile memory cells.

4. The method of claim 1, wherein said one or more memory operations includes a read operation, and during the read operation, said applying the bit line bias to the bit line electrically connected to the first end of the column of nonvolatile memory cells occurs at a same time as said floating the second end of the column of nonvolatile memory cells,
wherein said read operation is performed to determine at least one of the charge storage states by measuring a band-to-band current component.

5. The method of claim 1, wherein the substrate region is a well in a semiconductor substrate.

6. The method of claim 1, wherein each charge storage state stores one bit.

7. The method of claim 1, wherein each charge storage state stores multiple bits.

8. The method of claim 1, wherein each charge storage structure is a nanocrystal material.

9. The method of claim 1, wherein the charge storage structure is a nanocrystal material, and erase and programming bias arrangements are applied to change the charge storage states by injecting electrons into and ejecting electrons from the charge storage structure.

10. The method of claim 1, wherein each charge storage structure is a charge trapping material.

11. The method of claim 1, wherein the charge storage structure is a charge trapping material, and erase and programming bias arrangements are applied to change the charge storage states by injecting electrons into and injecting holes into the charge storage structures.

12. The method of claim 1, wherein each charge storage structure is a floating gate.

13. The method of claim 1, wherein each charge storage structure is a floating gate, and erase and programming bias arrangements are applied to change the charge storage states by injecting electrons into and ejecting electrons from the charge storage structures.

14. A nonvolatile memory integrated circuit storing data as charge storage states, comprising:
a nonvolatile memory array including a plurality of columns of memory cells, each memory cell including:
a substrate region having a first current carrying node and a second current carrying node;
a charge storage structure; and one or more dielectric structures at last partly between the charge storage structure and the substrate region and at least partly between the charge storage structure and a source of gate voltage;

wherein each column of the plurality of columns is arranged in a series having a first end and a second end such that adjacent first and second current carrying nodes of adjacent memory cells in said each column are electrically connected;

a plurality of bit lines each having a corresponding column of the plurality of columns of memory cells, wherein during at least one operation at least one bit line is electrically connected to the first end of the corresponding column and the second end of the corresponding column floats; and a plurality of word lines providing the gate voltage to the plurality of memory cells.

15. The integrated circuit of claim 14, further comprising:
a plurality of first pass transistors;
wherein during said at least one operation at least one of the plurality of bit lines is electrically connected to the first end of the corresponding column via one of the plurality of first pass transistors.

16. The integrated circuit of claim 14, wherein said at least one memory operation includes a program operation, and during the program operation, said at least one bit line is electrically connected to the first end of the corresponding column of nonvolatile memory cells and the second end of the corresponding column floats.

17. The integrated circuit of claim 14, wherein said one or more memory operations includes a read operation, and during the read operation, said at least one bit line is electrically connected to the first end of the corresponding column of nonvolatile memory cells and the second end of the corresponding column floats.

18. The integrated circuit of claim 14, wherein said one or more memory operations includes a read operation, and during the read operation, said at least one bit line is electrically connected to the first end of the corresponding column of nonvolatile memory cells and the second end of the corresponding column floats
wherein the read operation is performed to determine at least one of the charge storage states by measuring a band-to-band current component.

19. The integrated circuit of claim 14, wherein each of the charge storage states corresponds to the charge storage structure of one of the memory cells.

20. The integrated circuit of claim 14, wherein the substrate region is a well in a semiconductor substrate.

21. The integrated circuit of claim 14, wherein each charge storage state stores one bit.

22. The integrated circuit of claim 14, wherein each charge storage state stores multiple bits.

23. The integrated circuit of claim 14, wherein each charge storage structure is a nanocrystal material.

24. The integrated circuit of claim 14, wherein the charge storage structure is a nanocrystal material, and erase and programming bias arrangements are applied to change the charge storage states by injecting electrons into and ejecting electrons from the charge storage structure.

25. The integrated circuit of claim 14, wherein each charge storage structure is a charge trapping material.

26. The integrated circuit of claim 14, wherein the charge storage structure is a charge trapping material, and erase and programming bias arrangements are applied to change the charge storage states by injecting electrons into and injecting holes into the charge storage structures.

27. The integrated circuit of claim 14, wherein each charge storage structure is a floating gate.

28. The integrated circuit of claim 14, wherein each charge storage structure is a floating gate, and erase and programming bias arrangements are applied to change the charge storage states by injecting electrons into and ejecting electrons from the charge storage structures.

29. A nonvolatile memory integrated circuit storing data as charge storage states, comprising:
a column of memory cells, each memory cell including:
a substrate region having a first current carrying node and a second current carrying node;
a charge storage structure; and
one or more dielectric structures at last partly between the charge storage structure and the substrate region and at least partly between the charge storage structure and a source of gate voltage;
wherein the column is arranged in a series having a first end and a second end such that adjacent first and second current carrying nodes of adjacent memory cells in the column are electrically connected;
a bit line, wherein during at least one operation the bit line is electrically connected to the first end of the column and the second end of the column floats; and
a word line providing the gate voltage to the column of memory cells.

30. The integrated circuit of claim 29, further comprising:
a first pass transistor;
wherein during said at least one operation the bit line is electrically connected to the first end of the column via the first pass transistor.

31. The integrated circuit of claim 29, wherein said at least one memory operation includes a program operation, and during the program operation, the bit line is electrically connected to the first end of the column of nonvolatile memory cells and the second end of the column floats.

32. The integrated circuit of claim 29, wherein said one or more memory operations includes a read operation, and during the read operation, the bit line is electrically connected to the first end of the column of nonvolatile memory cells and the second end of the column floats.

33. The integrated circuit of claim 29, wherein said one or more memory operations includes a read operation, and during the read operation, the bit line is electrically connected to the first end of the column of nonvolatile memory cells and the second end of the column floats
wherein the read operation is performed to determine at least one of the charge storage states by measuring a band-to-band current component.

34. The integrated circuit of claim 29, wherein each of the charge storage states corresponds to the charge storage structure of one of the memory cells.

35. The integrated circuit of claim 29, wherein the substrate region is a well in a semiconductor substrate.

36. The integrated circuit of claim 29, wherein each charge storage state stores one bit.

37. The integrated circuit of claim 29, wherein each charge storage state stores multiple bits.

38. The integrated circuit of claim 29, wherein each charge storage structure is a nanocrystal material.

39. The integrated circuit of claim 29, wherein the charge storage structure is a nanocrystal material, and erase and programming bias arrangements are applied to change the charge storage states by injecting electrons into and ejecting electrons from the charge storage structure.

40. The integrated circuit of claim 29, wherein each charge storage structure is a charge trapping material.

41. The integrated circuit of claim 29, wherein the charge storage structure is a charge trapping material, and erase and programming bias arrangements are applied to change the charge storage states by injecting electrons into and injecting holes into the charge storage structures.

42. The integrated circuit of claim 29, wherein each charge storage structure is a floating gate.

43. The integrated circuit of claim 29, wherein each charge storage structure is a floating gate, and erase and programming bias arrangements are applied to change the charge storage states by injecting electrons into and ejecting electrons from the charge storage structures.

* * * * *